US012410056B2

(12) United States Patent
Ma et al.

(10) Patent No.: US 12,410,056 B2
(45) Date of Patent: Sep. 9, 2025

(54) SYSTEMS AND PROCESSES FOR PRODUCTION OF TRISILYLAMINE

(71) Applicants: LINDE GMBH, Pullach (DE); PENTAPRO MATERIALS INC., Taipei (TW)

(72) Inventors: Ce Ma, Apex, NC (US); Atul Athalye, San Marcos, CA (US); Carl Jackson, Thornton-Cleveleys Lancs (GB); Kuochou Yeh, Hsinchu (TW); Wen Che Kuo, Taipei (TW); Ying Chieh Hu, Tainan (TW)

(73) Assignees: Linde GmbH, Pullach (DE); Penta Pro Materials Inc., Taipei (TW)

( * ) Notice: Subject to any disclaimer, the term of this patent is extended or adjusted under 35 U.S.C. 154(b) by 739 days.

(21) Appl. No.: 17/642,982

(22) PCT Filed: Oct. 22, 2019

(86) PCT No.: PCT/IB2019/001134
§ 371 (c)(1),
(2) Date: Mar. 15, 2022

(87) PCT Pub. No.: WO2021/079164
PCT Pub. Date: Apr. 29, 2021

(65) Prior Publication Data
US 2022/0332579 A1    Oct. 20, 2022

(51) Int. Cl.
*B01J 19/18* (2006.01)
*B01J 12/00* (2006.01)
*B01J 19/00* (2006.01)
*C01B 21/087* (2006.01)

(52) U.S. Cl.
CPC .............. *C01B 21/087* (2013.01); *B01J 12/00* (2013.01); *B01J 19/006* (2013.01);
(Continued)

(58) Field of Classification Search
CPC ........ C01B 21/087; B01J 12/00; B01J 19/006; B01J 19/0066; B01J 19/1825;
(Continued)

(56) References Cited

U.S. PATENT DOCUMENTS

| | | | |
|---|---|---|---|
| 2010/0310443 A1* | 12/2010 | Miller | C01B 21/087 422/241 |
| 2014/0072497 A1* | 3/2014 | Doering | B01J 19/24 422/187 |

FOREIGN PATENT DOCUMENTS

| | | | |
|---|---|---|---|
| CN | 108586515 A | | 9/2018 |
| CN | 208071696 U | * | 11/2018 |
| WO | 2010141551 A1 | | 12/2010 |

OTHER PUBLICATIONS

Aylett, B. J., Hakim, M. J. (1966). The preparation and some properties of disilylamine. Inorganic Chemistry, 5(1), 167-167.
(Continued)

*Primary Examiner* — Huy Tram Nguyen

(57) ABSTRACT

Systems and processes for gas phase-phase synthesis of trisilylamine. One system includes a reactor vessel having a top, bottom, and sidewall having an inner surface. The reactor vessel includes inlets for gaseous reactants, and a gas inlet for an inert gas. In certain reactors the gas inlets are positioned near the top of the reactor vessel and configured to inject the reactant gases in the reactor substantially vertically and downward therefrom. Other reactors are cyclonic-shaped with tangential feeding of the gases. One or more baffles having a peripheral edge and substantially horizontally positioned in the reactor to define a reaction zone above the baffles and a separation zone below the baffles. The baffles are positioned in the reactor vessel such that there is a gap between the baffle peripheral edge and the
(Continued)

inner surface of the reactor vessel. Certain systems and processes include mechanical or static mixers.

23 Claims, 10 Drawing Sheets

(52) U.S. Cl.
CPC ....... *B01J 19/0066* (2013.01); *B01J 19/1825* (2013.01); *B01J 2219/00164* (2013.01)

(58) Field of Classification Search
CPC .......... B01J 2219/00164; B01J 19/2415; B01J 19/244; C07F 7/10; C23C 14/046
USPC ........................................................ 422/129
See application file for complete search history.

(56) References Cited

OTHER PUBLICATIONS

Aylett, B. J. (1968). Silicon hydrides and their derivatives. Advanced Inorganic Chemistry and Radiochemistry, 11, 249-307.

Beach, D. B. (1992). Infrared and Mass Spectroscopic Study of the Reaction of Silyl Iodide and Ammonia. Infrared Spectrum of Silylamine, Inorganic Chemistry. 31 (20), 4174-4177.

Burg, A. B., Kuljiais, E. (1950), Silyl-Amino Boron Compounds, Journal of the American Chemical Society, 72(7), 3103-3107.

Smith, D. L., Alimoda, A. S., Chen, C. C., Jackson, W., Wacker, B. (1988). Plasma chemistry control of silicon nitride, Materials Research Society Symposium Proceeding, 118, 107-112.

Stock, A.; Somieski, C. (1921). Siliciumwasserstoffe, X.: Stickstoffhaltige Verbindungen, Ber. Dtsch. Chem. Ges., 54, 740-758.

Wells, R. L., Schaeffer, R. (1966). Studies of Silicon-Nitrogen Compounds. The Base-Catalyzed Elimination of Silane from Trisilylamine, Journal of the American Chemical Society, 88(1), 37-42.

Wu, C. H. (1987). A Mass Spectrometric Study of Mercury-Photosensitized Reactions of Monosilane and Ammonia Mixtures: Observation of Silylated Amines, Journal of Physical Chemistry, 91, 5054-5057.

* cited by examiner

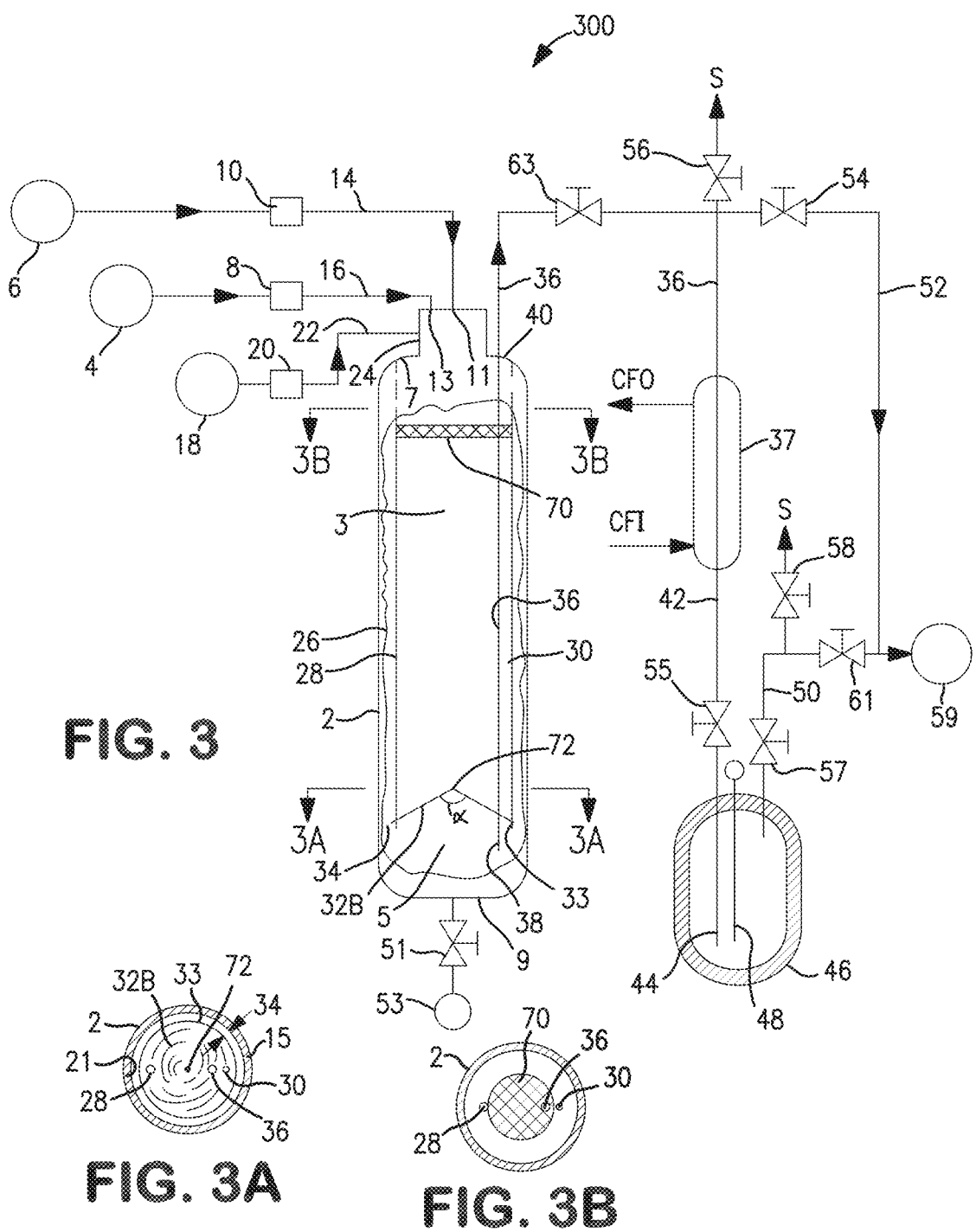

SYSTEMS AND PROCESSES FOR PRODUCTION OF TRISILYLAMINE

RELATED APPLICATIONS

This application claims the benefit of priority to International Application No. PCT/IB2019/001134, filed on Oct. 22, 2019, which is incorporated herein by reference in its entirety for all purposes.

BACKGROUND OF THE INVENTION

Technical Field

The present disclosure relates to processes and systems for production of trisilylamine In particular, the present disclosure relates to processes and systems featuring one or more baffles or other separating devices, and in certain embodiments one or more turbulence inducing features, inside a reactor producing trisilylamine.

Background Art

Trisilylamine is an important precursor for use in semiconductor manufacturing. It is widely used in producing silicon dielectric films into high aspect ratio (HAR) structures, such as shallow trench isolation (STI) in FinFET transistor processes and memory channel holes (or Macaroni bit lines) in 3D NAND flash memory processes. Under remote plasma excitation with other co-reactant gases, trisilylamine polymerizes and generates flowable liquid-like reaction intermediates onto the substrate surfaces. The flowable chemical vapor deposition (FCVD) is useful in challenging HAR gap fill applications that overcomes partial-fills or voids problems from conventional high-density plasma CVD gap fill using TEOS or other silicon precursors. The ability of forming flowable liquid intermediated by trisilylamine and its co-reactants is the key advantage for HAR gap fill. After the liquid intermediates flow into HAR gaps or holes, the filled intermediates continue to grow and to solidify into carbon-free and halogen-free Si:N:O:H containing polymers. Typical co-reactants are oxidants, such as nitrous oxide, $N_2O$. Follow-up steam ($H_2O$) and/or $O_3$ annealing steps will convert this polymer into high quality and high purity silicon dioxide, $SiO_2$, since it contains no carbon or halogen atoms. High purity $SiO_2$ is the best electric insolation film for device isolations.

Trisilylamine (TSA) may be prepared from silyl halide and ammonia. Preliminary tests by Stock and Somieski (1921) in the reaction of monochlorosilane (MCS) and ammonia ($NH_3$) found instantaneous reaction with precipitation of solid white matter. They could not decide, however, whether monosilylamine (MSA, $SiH_3(NH_2)$) or disilylamines (DSA, $(SiH_3)_2NH$) or trisilylamine (TSA, $(SiH_3)_3N$) had formed. The general mechanism for the formation of TSA was proposed to be a stepwise addition of silyl chloride and ammonia through the following schemes:

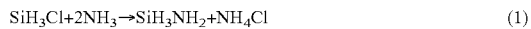
$$SiH_3Cl+2NH_3 \rightarrow SiH_3NH_2+NH_4Cl \quad (1)$$

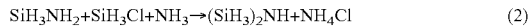
$$SiH_3NH_2+SiH_3Cl+NH_3 \rightarrow (SiH_3)_2NH+NH_4Cl \quad (2)$$

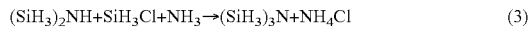
$$(SiH_3)_2NH+SiH_3Cl+NH_3 \rightarrow (SiH_3)_3N+NH_4Cl \quad (3)$$

And the overall reaction scheme is:

$$3SiH_3Cl+4NH_3 \rightarrow (SiH_3)_3N+3NH_4Cl \quad (4)$$

Stock and Somieski (1921) also reported that the reaction of excess ammonia with MCS resulted in the formation of TSA, silane, and the nonvolatile polysilazane. They suggested two modes of decomposition of DSA; one is a hydrogen migration:

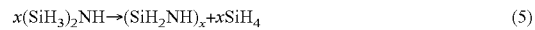
$$x(SiH_3)_2NH \rightarrow (SiH_2NH)_x + xSiH_4 \quad (5)$$

The other involves Si—N disproportionation:

$$3(SiH_3)_2NH \rightarrow 2(SiH_3)_3N+NH_3 \quad (6)$$

Burg and Kuljiais (1950) reported high yields of TSA when gaseous ammonia is introduced slowly (non-turbulently) into gaseous MCS. For a good yield, they reported that the chlorosilane must be pure, and the gaseous ammonia must be introduced slowly into the gaseous MCS from below. The best yield of TSA represented 80% of the ammonia employed.

Wells and Schaeffer (1966) discussed a batch method of preparing TSA by the reaction silyl chloride with ammonia. They reported the yields of TSA varied depending on the method of mixing and the purity of the reactants. They allowed the reactants to mix in the gas phase by introducing the ammonia from below into a 1-liter bulb containing silyl chloride. After introducing the gaseous ammonia very slowly, the reaction bulb and contents were allowed to remain at room temperature for 15 min. Copious amounts of white solid were precipitated on the walls of the bulb as soon as mixing occurred. The product was removed and the trisilylamine recovered. The process yield was about 77% of the theoretical amount of trisilylamine. They also studied the reactions of bases with TSA, and it has been found that a reaction takes place in the liquid phase. Silane is always formed in these reactions, and under certain conditions N,N',N"-trisilylcyclotrisilazane can be prepared according to the following scheme:

$$xNH_3+3(SiH_3)_3N \rightarrow 3SiH_4+(SiH_3NSiH_2)_3+xNH_3 \quad (7)$$

The reaction mechanism for synthesis of TSA has been subjected extensive studies. In particular, the detection of the key intermediate, monosilylamine (MSA), has been unsuccessful leading to the doubt of reaction (1) by Aylett (1968). The existence of DSA is however confirmed. Aylett and Hakim (1966) have reported the preparation of DSA from diphenylaminosilane and ammonia at low temperatures. They determined that reaction (6) did not occur in the gas phase but that this disproportionation reaction occurred slowly in the liquid phase at 0° C. They also observed that the reaction of DSA and silyl iodide did not occur rapidly (if at all) in the gas phase but that this reaction is rapid and nearly quantitative in a condensed phase to give 87% of the TSA:

$$4(SiH_3)_2NH+SiH_3I \rightarrow 3(SiH_3)_3N+NH_4I \quad (8)$$

Recently, in situ mass spectroscopic studies of silane/ammonia chemical vapor deposition (CVD) processes have led to the detection of MSA. MSA was first observed by Wu (1987) in a study of the mercury-sensitized photochemistry of silane/ammonia mixtures. Wu reported that MSA decomposed in the dark and with a half-life of 1-20 h, depending on the surface preparation of the gas cell. MSA has also been observed in a study of silane/ammonia plasma-enhanced CVD using a triple-quadrapole mass spectrometer by Smith et al. (1988).

The reaction of silyl iodide and ammonia has been studied by Beach (1992) under slowly flowing conditions using FTIR spectroscopy and mass spectroscopy. At low (0.01 mbar) partial pressures of silyl iodide in excess ammonia, MSA was the only silylamine observed. At a silyl iodide pressure of 0.1 mbar, a significant amount (~10%) of DSA was observed, demonstrating that both MSA and DSA intermediates are produced in the gas phase. TSA was not observed in the gas-phase reaction of silyl iodide and ammonia under the low-pressure conditions studied. This study confirms that MSA is the reaction product formed by the gas-phase reaction of ammonia and silyl iodide. Second, the MSA formed is sufficiently basic to rapidly react with a second molecule of silyl iodide to form DSA, even in the gas phase. This is in contrast to the reactivity of DSA with silyl iodide, which does not react in the gas phase but only in a condensed phase according to reaction (8). MSA does not rapidly disproportionate, even in the presence of excess ammonia, consistent with the observation of Wu (1987) who observed only a slow disproportionation reaction, probably occurring at the reactor walls. DSA also does not disproportionate in the gas phase. Finally, MSA and DSA do not rapidly react to form trisilylamine. These observations indicate that the primary pathway for the synthesis of TSA from halosilane and ammonia is the stepwise silylation of ammonia to MSA to DSA and ultimately to TSA.

The above studies on the mechanism for synthesis of TSA is crucial for understanding the drawbacks of existing processes. Various processes have been developed for industrial scale synthesis of TSA, but each has one or more drawbacks. Various efforts in this area may be exemplified by U.S. Pat. Nos. 8,409,513B2; 8,568,682 B2; and 9,284,198 B2. U.S. Pat. No. 8,409,513 describes a tubular flow gas phase reactor and a batch process for the synthesis of silylamines. The reactor has a combination of characteristics found in plug flow and laminar flow devices and is said to result in a high-volume high efficiency synthesis of silylamines. However, this process produces large amount of ammonium halide solid depositing on the tube wall and feed nozzles which not only plugged the reactor tube but also limited the available production capacity. The reaction tube is thus needed to be opened and cleaned after each production batch is produced. The cleaning is a labor-intensive process leading to significant down time. To minimize the deposition on reactor wall, non-stick material such as a fluoropolymer is used. Although the tubular reactor diameter can be increased to increase available capacity, the mixing and the thus the reaction efficiency deteriorate with increasing tube diameter. In additional, the process also results in a large amount of DSA alongside of the TSA which would require subsequent conversion to TSA. In the demonstrated example, the DSA conversion to TSA was done with excess silyl halide in a relative short time during warm up of the collected product liquid. The conversion however results in solid ammonium chloride (AMC) in the TSA/DSA mixture which requires an additional separation step. The separated AMC still contained part of TSA/DSA and thus requires special treatment waste process. An extra separation step is also needed to separate and recycle the excess silyl halide to reduce the cost.

U.S. Pat. No. 8,568,682 B2 describes a condensed phase batch process for synthesis of TSA. An improved synthesis method that incorporates a solvent to help promote a condensed-phase reaction between ammonia gas (or liquid) and liquified MCS in good yields is described. The solvent used include anisole, toluene, and xylene. This method is said to facilitate the removal of the byproduct waste with little to no reactor down time, substantial reduction of down-stream solids contamination and high purity product from first-pass distillation. The best TSA yield is about 94%. About 6% of the collected crude is estimated to be carried-over to solvent, salt and heavies. The crude products contained TSA as well as DSA with the ratio of 2:1, plus silane and excess MCS. Thus, extra steps are also needed to separate and recycle the excess MCS, and the convert DSA to TSA.

U.S. Pat. No. 9,284,198 B2 describes a process for producing trisilylamine with the aim of very little DSA formation. A reaction mixture of trisilylamine and monochlorosilane are fed into a reactor wherein the reaction mixture is at a temperature and pressure sufficient to provide trisilylamine in a liquid phase without any added solvent. Ammonia is sparged through the reaction mixture to provide a crude mixture comprising trisilylamine and an ammonium chloride solid wherein monochlorosilane is in stoichiometric excess in relation to ammonia. The TSA is produced at a purity level of 90% or greater with less than 1% DSA formed. The process yield is 80% or greater. This process also limits solids ammonium chloride formation to a single reactor for ease of cleaning. The process however has the disadvantages of recycling the excess MCS and separating ammonia chloride from the liquid products.

All liquid-phase processes of producing TSA suffer from the fact that ammonium chloride actually catalyzes the decomposition of TSA liquid, and the ammonium chloride has the further disadvantage of trapping the silylamine products. This leads to additional loss in TSA yield and requiring special treatment for disposing the ammonia chloride. Moreover, liquid phase reactions allow formation of other, undesirable compounds, such as N,N',N''-trisilylcyclotrisilazane, and at least at temperatures around 0° C., disproportionation (reaction (6)) occurs, albeit slowly in the liquid phase at 0° C.

As may be seen, current practice may not be adequate for all circumstances, and may result in more separation steps being required, and/or lower TSA recovery. There remains a need for more robust TSA production processes and systems. The processes and systems of the present disclosure are directed to these needs.

SUMMARY OF THE INVENTION

In accordance with the present disclosure, processes and systems are described which reduce or overcome many of the faults of previously known systems and processes. The systems and processes of the present disclosure allow production of TSA in large quantities in gas phase with ease of operation and high selectivity to TSA over DSA. Moreover, the product containing TSA, DSA and other byproducts may be passed to a separating system to separate DSA from TSA and convert DSA into TSA without forming solid ammonium halide in the TSA product.

A first aspect of the disclosure are systems for gas-phase synthesis of trisilylamine, in certain embodiments comprising:

(a) a reactor vessel (2) having a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);

(b) one or more baffles (32) having a peripheral edge (33), the one or more baffles (32) substantially horizontally positioned in the reactor vessel (2) at a position to define a reaction zone (3) above the one or more baffles

(32) extending to the top (7) of the reactor vessel (2) and a separation zone (5) below the one or more baffles (32) extending to the bottom of the reactor vessel (2);
(c) the one or more baffles (32) positioned in the reactor vessel (2) such that there is a gap (34) between the peripheral edge (33) and the inner surface (21) of the reactor vessel (2); and
(d) a reaction products collection conduit (36) having an inlet end (38) positioned in the separation zone (5), where the reaction products include trisilylamine.

It should be understood that in certain embodiments baffles may be substituted by (or may include, in addition to one or more baffles) one or more other separation devices, such as packings, screens, trays, walls, partitions, grids, and the like. In certain embodiments the reactor vessel (2) may be cylindrically shaped and have a length (L), a diameter (D), and an L/D ratio, where the L/D ratio ranges from about 0.1 to about 100, or from about 1 to about 10.

In certain embodiments the reaction products collection conduit (36) may include a particle filter.

Certain embodiments may comprise a heating and/or cooling sub-system (H/C) thermally connected at least with the reaction zone (3) for temperature control. In certain embodiments the heating and/or cooling sub-system (H/C) may be configured to maintain the reaction zone (3) at a temperature ranging from about −20° C. to about 180° C., or from about 10° C. to about 150° C., or from about 40° C. to about 150° C.

Certain embodiments may comprise a condensation trap (51) fluidly connected to the separation zone (5) at or near the bottom (9) of the reactor vessel (2) and configured to be maintained at a temperature ranging from about −10° C. to about −80° C. for removing silylamines from the reaction products, or configured to be maintained at a temperature ranging from about −20° C. to about −40° C. for removing silylamines from the reaction products.

In certain embodiments the reactor vessel (2) may be configured to operate at temperature and pressure conditions such that the ammonia, the monohalosilane, and the reaction products silylamines are all in gas phase. In certain embodiments the reactor vessel (2) may be configured to operate at pressures ranging from about 0.01 to about 15 bar (about 1 to about 1500 kPa), or from about 0.1 to 10 bar (about 10 to about 1000 kPa), or from about 0.2 to about 5 bar (about 20 to about 500 kPa). In certain embodiments the reactor vessel (2) may be configured to operate at temperature and pressure conditions such that the ammonia, the monohalosilane, and the reaction products silylamines are all in gas phase.

In certain embodiments the one or more baffles (32) may be selected from the group consisting of flat plate baffles (32, 32C), corrugated plate baffles (32A), and cone-shaped baffles (32B), and the one or more baffles (32, 32A, 32B, and 32C) may be supported by brackets selected from the group consisting of two or more hanger support brackets (28, 30) connected at or near the top (7) of the reactor vessel (2) and two or more local support brackets (92) connected to the inner surface (21) of sidewall (15).

Certain embodiments may further include a disproportionation unit (101) comprising a distillation column (120), a disproportionation reactor (126), a condenser (132), and an accumulator (136), the distillation column (120) fluidly connected to a condensation trap (51) by a feed conduit (122). In these embodiments, the condensation trap (51) is fluidly connected to the separation zone (5) at or near the bottom (9) of the reactor vessel (2). The distillation unit (120) is fluidly connected to the disproportionation reactor (126) by a conduit (124), and a TSA rich stream conduit (142) may route a TSA rich stream from the distillation unit (120) to mix with TSA in product conduit (36). The disproportionation reactor (126) has a disproportionation product conduit (128) and a conduit (130) for routing ammonia and volatiles to the condenser (132), the condenser (132) having a conduit (134) for routing DSA liquid to the accumulator (136), and the accumulator (136) having a recycle conduit (140) and recycle pump (138) for routing DSA liquid from the accumulator (136) to the disproportionation reactor (126).

Certain embodiments may comprise one or more redundant components, for example, two or more pumps arranged in series or parallel flow relationship, or two or more separators arranged in series or parallel flow relationship. Embodiments with mixed parallel and series flow are also contemplated, for example, an arrangement of four separators where first and second separators are arranged in parallel with each other, third and fourth separators are arranged in parallel with each other, and where the first is in series with the third, and the second is in series with the fourth.

A second aspect of the disclosure are systems for gas-phase synthesis of trisilylamine similar to the systems of the first aspect, but in certain embodiments comprising one or more turbulence inducing mixing structures (60, 70) positioned in the reaction zone (3). In certain embodiments the one or more turbulence inducing mixing structure (60, 70) may be selected from the group consisting of one or more mechanical stirrers (60) and one or more static mixers (70). In certain embodiments the one or more mechanical stirrers (60) may be selected from the group consisting of motor-driven impellers and magnetic stirrers. In certain embodiments the one or more static mixers (70) may be selected from the group consisting of porous ceramic materials, porous polymeric materials, porous steel mesh materials, and like materials, and the one or more static mixers (70) may be supported by brackets selected from the group consisting of two or more hanger support brackets (28, 30) connected at or near the top (7) of the reactor vessel (2) and two or more local support brackets (92) connected to the inner surface (21) of sidewall (15).

A third aspect of the disclosure are systems for gas-phase synthesis of trisilylamine comprising:
(a) a cyclonic reactor vessel (2) having a top (7), a bottom (9), a conical sidewall section (80), a tangential feed chamber (82), and a substantially cylindrical sidewall section (84), the conical sidewall section (80) connecting the substantially cylindrical sidewall section (84) and the bottom (9), the tangential feed chamber (82) including first (11) and second (13) gas inlets for gaseous reactants ammonia and monohalosilane, and a third gas inlet (17) for an inert gas, wherein at least the first and second gas inlets (11, 13) and the tangential feed chamber (82) are configured to inject the ammonia and the monohalosilane substantially horizontally and tangentially into the substantially cylindrical section (84) and then into the conical sidewall section (80);
(b) one or more baffles (32C) having a peripheral edge (33), the one or more baffles (32C) substantially horizontally positioned in the reactor vessel (2) at a position to define a reaction zone (3) above the one or more baffles (32C) extending to the top (7) of the reactor vessel (2) and a separation zone (5) below the one or more baffles (32C) extending to the bottom (9) of the reactor vessel (2);

(c) the one or more baffles (32C) positioned in the reactor vessel (2) such that there is a gap (34) between the peripheral edge (33) and the inner surface (21) of the reactor vessel (2); and (d) a reaction products collection conduit (36) having an inlet end (38) positioned in the separation zone (5), where the reaction products include trisilylamine.

Certain embodiments may comprise a monohalosilane purification sub-system comprising:

a first separator (102) configured to accept an impure monohalosilane stream (4A) and produce a silane and lighter compounds stream (108) and an enriched monohalosilane stream (106), a second separator (104) configured to accept the enriched monohalosilane stream (106) and produce a reactor feed monohalosilane stream (16) and polysilanes and heavier stream (112).

Certain embodiments may comprise a source of fluorine or fluorine plasma (94) fluidly connected to the reactor vessel (2), the fluorine or fluorine plasma adapted to clean the reactor vessel (2), the system further comprising a conduit for routing a cleaning exhaust stream to an exhaust or waste handling system (90).

A fourth aspect of the disclosure are processes for gas-phase synthesis of trisilylamine employing a system of the present disclosure. Certain process embodiments may comprise a) feeding gaseous ammonia and gaseous monohalosilane under pressure into a reaction vessel downward and substantially vertically toward a separation device in the reaction vessel, the reaction vessel having an internal wall; b) separating ammonium chloride solids from gaseous silylamine products within the reactor vessel by use of the separation device and a gap between the separation device and the reaction vessel internal wall; and c) collecting the gaseous silylamine products. Certain other process embodiments may comprise a) feeding gaseous ammonia and gaseous monohalosilane under pressure into a reaction vessel downward and substantially vertically toward and through a turbulence inducing device in the reaction vessel, the reaction vessel having an internal wall; b) allowing at least some of the ammonium chloride solids to deposit on the reaction vessel internal wall while forming gaseous silylamine products; c) optionally, separating ammonium chloride solids from gaseous silylamine products within the reactor vessel by use of a separation device and a gap between the separation device and the reaction vessel internal wall; and d) collecting the gaseous silylamine products. Certain other process embodiments may comprise a) injecting ammonia and monohalosilane substantially horizontally and tangentially into a substantially cylindrical section; b) flowing the ammonia and monohalosilane into a conical sidewall section of the reactor vessel connected to the substantially cylindrical section and toward a separation device in the reaction vessel, the reaction vessel having an internal wall; c) separating ammonium chloride solids from gaseous silylamine products within the reactor vessel by use of the separation device and a gap between the separation device and the reaction vessel internal wall; and d) collecting the gaseous silylamine products.

The terms "MCS" and "DCS" as used herein denote monochlorosilane and dichlorosilane. However, those skilled in the art will appreciate that any monohalosilane may be employed, or mixtures thereof, to react with ammonia to produce TSA. For brevity, the terms MCS and DCS will represent all monohalidesilanes and dihalosilanes, respectively. The term "product stream" means a composition consisting essentially of TSA and having from about 2 to about 4 mole percent MCS, DCS, silane, and other undesirables therein, and substantially devoid of solid ammonium chloride. As used herein "separator" means a unit employing one or more separation techniques, including, but not limited to cryogenic separation, membrane separation, adsorption media separation, distillation, absorption, stripping, scrubbing, solvent extraction, or combination thereof. As used herein "conduit" means a component or combination of components (as detailed herein) operatively and fluidly connecting one or more units to one or more other units. As used herein the terms "source" and "receiver" may refer to a pipeline, storage tank, sample container, storage cylinder, tank truck, or any combination thereof.

In certain embodiments one or more logic devices may be provided to control the systems and processes of the present disclosure, and the logic device may be configured to be operated and/or viewed from a Human/Machine Interface (HMI) wired or wirelessly connected to the logic device. Certain embodiments may include one or more audio and/or visual warning devices configured to receive communications from the logic device upon the occurrence of a pressure rise (or fall) in a sensed pressure above (or below) a set point pressure, or a change in concentration of one or more sensed concentrations or temperatures, or both, above one or more set points. The occurrence of a change in other measured parameters outside the intended ranges may also be alarmed in certain embodiments. Other measured parameters may include, but are not limited to, gas flow rate, vapor flow rate, multiphase fluid flow rate, liquid flow rate, and density of any of these.

Certain system and process embodiments of this disclosure may comprise starting up or shutting down one, more than one, or all operational equipment using one or more logic devices and certain valves (for example as dictated by a client, law, or regulation), and in the case of shutting down, upon the occurrence of an adverse event. As used herein, the term "operational equipment" includes, but is not limited to, gas reactant feed sources, inert gas feed sources, separators, heat exchangers, conduits, pumps, valves, plasma sources, exhaust systems, and the like.

Certain system and process embodiments of this disclosure may operate in modes selected from the group consisting of automatic continuous mode, automatic periodic mode, and manual mode. In certain embodiments the one or more operational equipment may include prime movers selected from the group consisting of pneumatic, electric, fuel, hydraulic, and combinations thereof.

In certain embodiments, pressure (P) and/or temperature (T) may be sensed inside the reactor vessel, separators, TSA collection vessel, valve inlet and outlets, and the like. Different embodiments may have different sensor strategies, for example, a mass flow sensor/controller for one gaseous reactant sensing mass flow rate inside a supply conduit for that reactant, another sensing mass flow rate inside a second gaseous reactant feed conduit. All combinations of sensing T, P, and/or mass flow rate of reactants and reaction products are disclosed herein and considered within the present disclosure.

Systems of the present disclosure may include pressure management components and associated components, for example, but not limited to pressure control devices (back-pressure valves), pressure relief devices (valves or explosion discs), expansion valves, pipes, conduits, vessels, towers, tanks, mass flow meters, temperature and pressure indicators, heat exchangers, pumps, compressors, and expanders.

These and other features of the processes and systems of the present disclosure will become more apparent upon review of the brief description of the drawings, the detailed description, and the claims that follow. It should be understood that wherever the term "comprising" is used herein, other embodiments where the term "comprising" is substituted with "consisting essentially of" are explicitly disclosed herein, and vice versa. It should be further understood that wherever the term "comprising" is used herein, other embodiments where the term "comprising" is substituted with "consisting of" are explicitly disclosed herein, and vice versa. Moreover, the use of negative limitations is specifically contemplated; for example, certain baffles and mixing devices may be devoid of any material that would catalyze destruction of TSA. In certain embodiments the MCS gaseous reactant may not include more than 2 mole percent, or more than 1 mole percent, or more that a trace of DCS. As another example, a fluorine-based gas may be devoid of any components that may react in an explosive fashion with ammonium chloride solid.

BRIEF DESCRIPTION OF THE DRAWINGS

The manner in which the objectives of this disclosure and other desirable characteristics can be obtained is explained in the following description and attached drawings in which:

FIGS. 1-4 are high-level schematic process flow diagrams of four non-limiting system and process embodiments in accordance with the present disclosure, with some parts cut away, while

FIGS. 1A, 2A, 3A, 3B, and 4B are schematic cross-sectional views illustrating certain features of the four embodiments illustrated schematically in FIGS. 1-4;

It is to be noted, however, that the appended drawings of FIGS. 1-5, 1A, 2A, 3A, 3B, 4A, and 4B are not to scale, and illustrate only typical system and process embodiments of this disclosure. Furthermore, FIGS. 6-9 illustrate only four of many possible processes in accordance with this disclosure. Therefore, the drawing figures are not to be considered limiting in scope, for the disclosure may admit to other equally effective embodiments. Identical reference numerals are used throughout the several views for like or similar elements.

DETAILED DESCRIPTION

Figure 1:
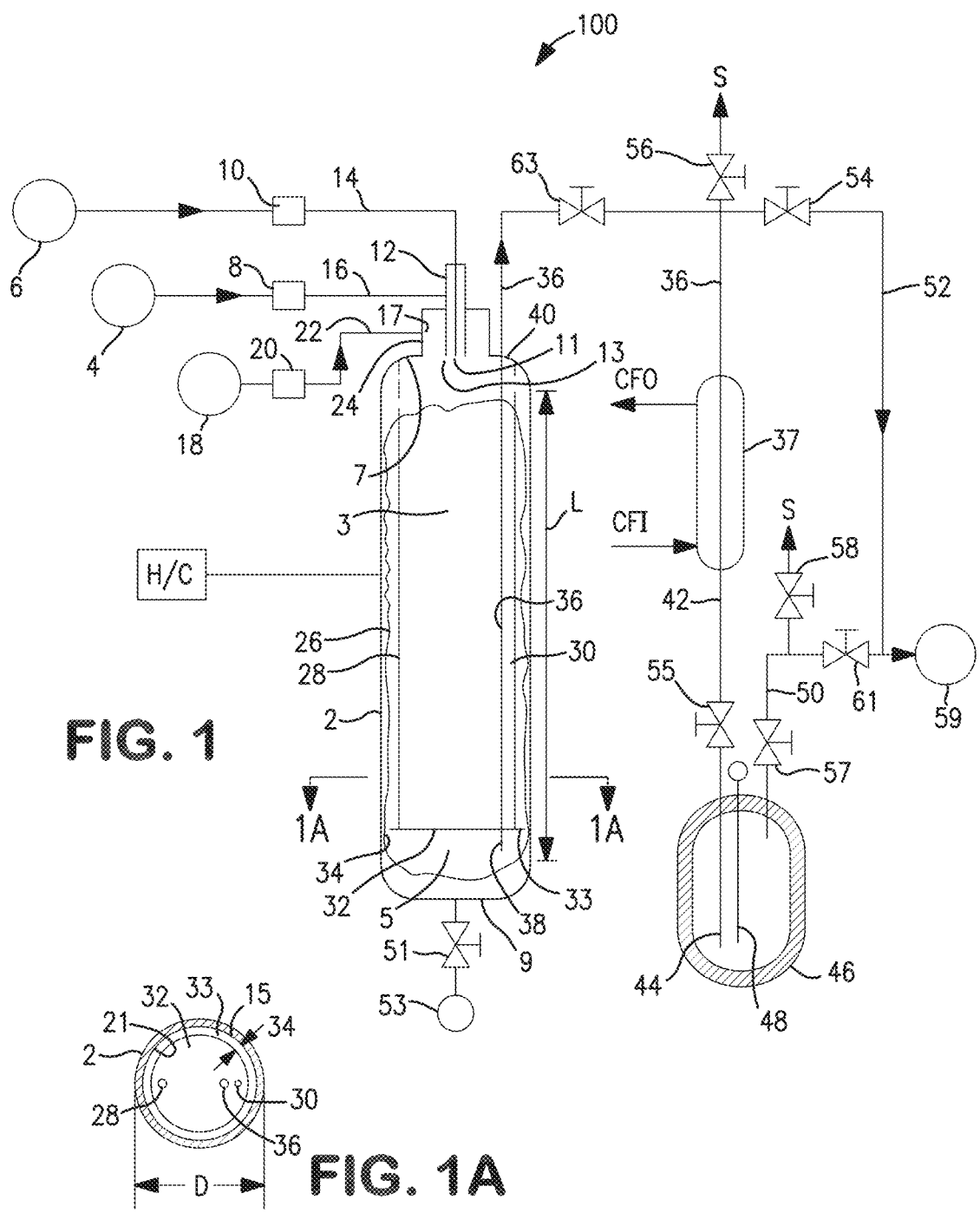

In the following description, numerous details are set forth to provide an understanding of the disclosed apparatus, systems, and processes. However, it will be understood by those skilled in the art that the apparatus, systems, and processes disclosed herein may be practiced without these details and that numerous variations or modifications from the described embodiments may be possible. All technical articles, U.S. published and non-published patent applications, standards, U.S. patents, U.S. statutes and regulations referenced herein are hereby explicitly incorporated herein by reference, irrespective of the page, paragraph, or section in which they are referenced.

Where a range of values describes a parameter, all sub-ranges, point values and endpoints within that range or defining a range are explicitly disclosed herein. All percentages herein are by weight unless otherwise noted. All physical property, dimension, and ratio ranges and sub-ranges (including endpoints) between range end points for those properties, dimensions, and ratios are considered explicitly disclosed herein. As used herein with respect to pressure, "about" means +/−0.5 bar (+/−50 kPa). As used herein with respect to temperature, "about" means +/−10° C. As used herein with respect to aspect ratio (length to diameter ratio, or L/D), "about" means +/−1 for values below 10, and +/−5 for values of 10 and above 10. As used herein with respect to length and diameter, "about" means +/−10 cm, in certain embodiments +/−5 cm. As used herein with respect to angles, including angles to horizontal and vertical, "about" means +/−15 degrees, in certain embodiments +/−10 degrees, and in certain other embodiments within +/−5 degrees.

As mentioned herein, one of the challenges of all liquid-phase processes of producing TSA is that they suffer from the fact that ammonium chloride actually catalyzes the decomposition of TSA liquid, and the ammonium halide has the further disadvantage of trapping the silylamine products. This leads to additional loss in TSA yield and requiring special treatment for disposing the ammonia halide. Moreover, liquid phase reactions allow formation of other, undesirable compounds, such as N,N',N"-trisilylcyclotrisilazane, and at least at temperatures around 0° C., disproportionation (reaction (6)) occurs, albeit slowly in the liquid phase at 0° C. In configurations considered outside of those presently disclosed, in order to use the TSA produced in a liquid-phase process, further processing of the reaction product containing TSA is required, creating not only extra expense but a waste disposal issue. The systems and processes of the present disclosure address these issues by using a gas-phase reaction with one or more internal baffles in the reactor that allow TSA to be collected with little or only trace quantities of ammonium halide solid. Alternatively, or in conjunction with the one or more baffles, systems may employ turbulent conditions in the reactor, rather than laminar conditions. Systems and processes of the present disclosure therefore not only allow relatively pure TSA to be produced but resolve a waste disposal issue, providing cost savings in both reduced capital expense and reduced operating expense when compared to previously known systems and processes. None of the documents discussed in the Background mention use of one or more baffles, or use of turbulent reaction conditions, as taught by the present disclosure.

It is known that gaseous silyl halides react with gaseous ammonia to generate gaseous silylamines and solid ammonium halide. Unlike a liquid-phase reaction, solid ammonium halide formed in a gas-phase reaction does not catalyze the decomposition of TSA and does not trap the silylamine products. However, the solid ammonium halide plugs the reactor and the feed and product ports quickly which reduces the available volume of reaction and limits the production capacity.

It has surprisingly been found that the ammonium halide powder can be separated from the gaseous stream with the use of one or more baffle plates positioned in the reactor vessel as described herein. The baffle plate(s) is/are preferably placed in a downflow direction in which gases are fed from top of the reactor vessel. A majority of ammonium halide powder will deposit on the baffle plate. A small amount of powder will pass along with the vapor. It is surprisingly found that when the gap between the baffle plate and the vessel wall is sufficiently small, part of the powder can be built on the gap such that the powder layer can act as a filter to retain more powder while keep the gaseous product passing through. The result is a clean separation of solid ammonium halide and gaseous silylamines. Without being bound by any theory, the inventors have reason to believe that the one or more baffles can generate eddy flow within and/or outside the immediate reaction zone where the incoming gases begin to react with each other. The incoming reactant gas flow that is directed in a downward direction from the inlet of the reactor vessel, and mixed with locally present reaction intermediates and products, can undergo recirculation in an upwards direction upon impacting the surface of the one or more baffles. Such recirculation phenomena are believed to disrupt any laminar flow patterns existing in the reaction zone, even in the absence of a physical mixing device such as an impeller. The recirculation flow pattern has been determined by the inventors to contribute to effective mixing within the reaction zone, whereby the AMC solids deposit on the available baffle surfaces including previously deposited AMC solids, and the gaseous products escape through the gap between the baffle plate and the wall of the reactor vessel. It has also surprisingly been found that mechanical mixing devices can greatly promote the reaction between silyl halide and ammonia which gives higher ratio of TSA to DSA.

Figure 4:
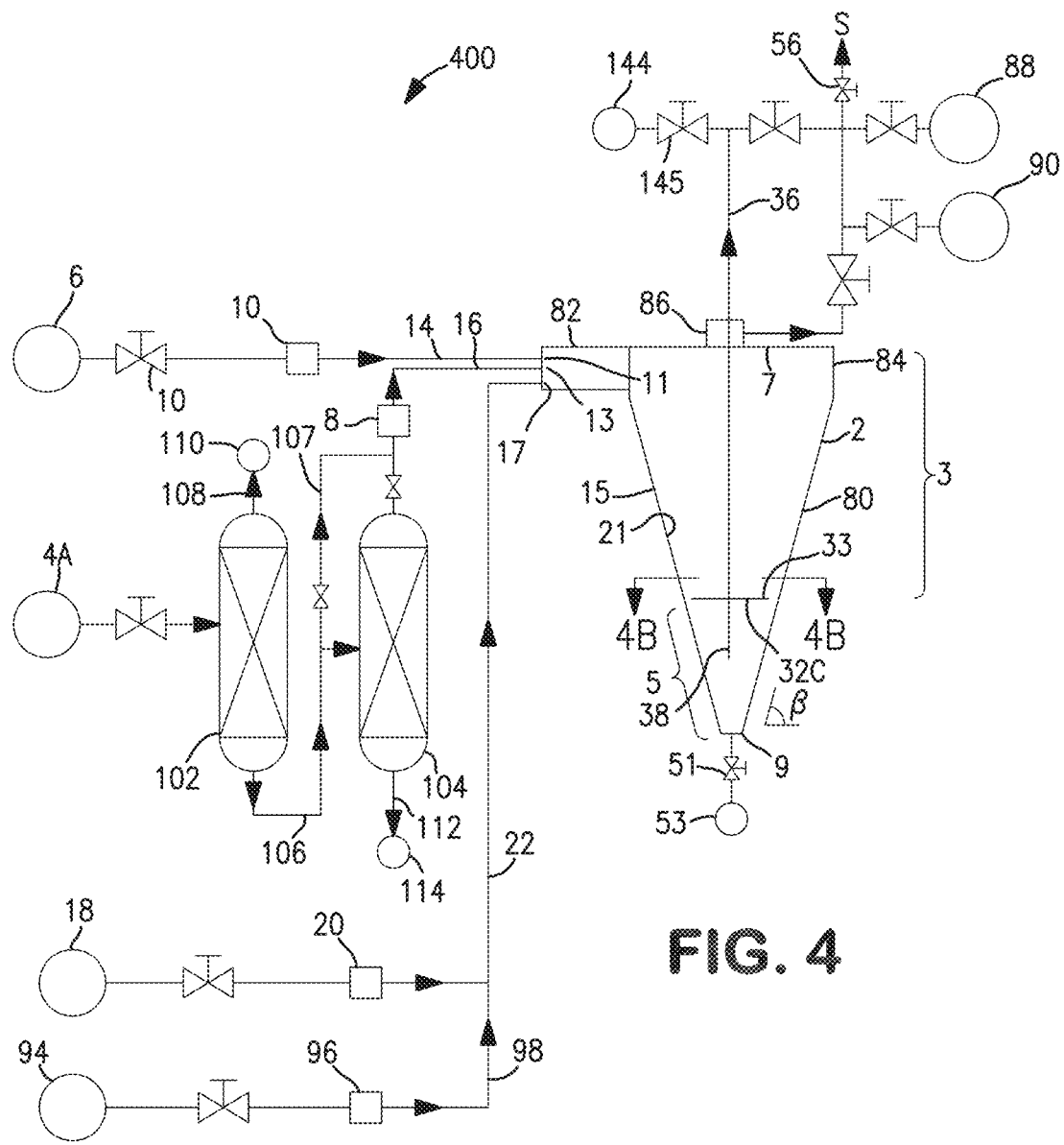
Figure 4A:
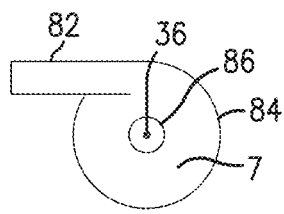
FIG. 4A is a schematic plan view illustration of the embodiment illustrated schematically in FIG. 4.

Referring now to the drawing figures, FIGS. 1-4 are high-level schematic process flow diagrams of four non-limiting system and process embodiments in accordance with the present disclosure, with some parts cut away, while FIG. 4A is a schematic plan view illustration of the embodiment illustrated schematically in FIG. 4, and FIGS. 1A, 2A, 3A, 3B, and 4B are schematic cross-sectional views illustrating certain features of the four embodiments illustrated schematically in FIGS. 1-4. Features common to all system embodiments, such as reactor vessel length (L), diameter (D), and thermal control (H/C) as indicated in FIGS. 1 and 1A, respectively, are not illustrated in the remaining figures for brevity.

Referring first to FIGS. 1 and 1A, system embodiment 100 includes a reactor vessel (2), a source (4) of MCS, and a source (6) of ammonia. The flow rates of MCS and ammonia are controlled by mass flow controllers (8) and (10), respectively, through conduits (14) and (16) to an annular nozzle (12) forming first and second gas inlets (11, 13) to reactor vessel (2). Reactor vessel (2) includes a top (7), a bottom (9), and a sidewall (15), the latter having an inner surface (21) (see FIG. 1A). System embodiment 100, as well as other systems of the present disclosure, may have a thermal control unit (H/C) for temperature control of the reactor vessel via heating or cooling. System 100 further includes a source of inert gas (18) for routing an inert gas such as nitrogen, argon, or other inert gas, or mixture thereof, to reactor vessel (2) via another mass flow controller (20) and conduit (22) fluidly connected to a third gas inlet (17) in an outer conduit (24) of annular nozzle (12). Through suitable valving and manifolds, other arrangements will be within the skilled artisan. For example, inert gas could simply be routed into one of the gas reactant conduits.

Referring again to FIG. 1, more specifically to the components within cut-away portion 26, reactor vessel (2) includes an internal flat, horizontal baffle plate (32) that effectively separates the reactor vessel (2) internal volume into a reaction zone (3) and a separation or product collection zone (5). Although as discussed herein baffle plate (32) performs the major separation function, separating solid ammonium halides form the gaseous products, region (5) will be referred to herein as the separation zone as a matter of convenience. Referring to the cross-sectional view 1A-1A presented in FIG. 1A, baffle plate (32) in this embodiment is essentially a flat, round disk having a peripheral edge (33) that is spaced away from inner surface (21) of reactor vessel sidewall (15) by a gap (34). Gap (34) may range from about 0.01 mm to about 10 mm, in certain embodiments from about 0.02 mm to about 5 mm. Multiple baffle plates may be installed with the same or decreasing gaps to ensure a minimum passage of halide powder into downstream product stream. Baffle plate (32) is, in embodiment 100, supported by a pair of baffle supports (28, 30). A reaction products collection conduit (36) having an inlet end (38) is positioned such that its inlet end (38) extends below baffle plate (32), and the balance of reaction products conduit (36) extends (in this embodiment) substantially vertically through reaction zone (3), through a fitting (40) on reactor vessel top (7), and on through conduit (36) and valve (63) to a reaction products cooler (37) having cooling fluid inlet (CFI) and cooling fluid outlet (CFO). A cooled reaction products conduit (42) having a distal end (44) routes the cooled reaction products to a TSA collection vessel (46) that is insulated or immersed in a cooling bath fitted with a pressure gauge (48). The distal end (44) of conduit (42) is extended to a position near the bottom of TSA collection vessel (46). A TSA supply conduit (50), aided by valves (57, 61) routes TSA to a downstream semiconductor manufacturing process (for example, but not limited to, CVD) or to storage (59). Samples (S) of TSA may be acquired through sample valves (56, 58). Valves (55, 57) may be used to isolate TSA collection vessel (46). A bypass conduit (52) and bypass valve (54) may be used to bypass product cooler (37) and product collection vessel (46) in certain modes of operation, for example, during inerting or cleanout operations, or other maintenance. Other valves (not illustrated for brevity) may be employed to isolate reaction vessel (2) and product cooler (37).

System embodiment 100 further includes a condensation trap (51) fluidly connected to the separation zone (5) at or near the bottom (9) of the reactor vessel (2) and configured to be maintained at a temperature ranging from about −10° C. to about −80° C. for removing silylamines from the reaction products, or configured to be maintained at a temperature ranging from about −20° C. to about −40° C. for removing silylamines from the reaction products. In certain embodiments, condensed material from condensation trap (51) may be routed to waste (53) or to a disproportionation unit as further explained in reference to FIG. 5 herein.

Figures 2, 2A:
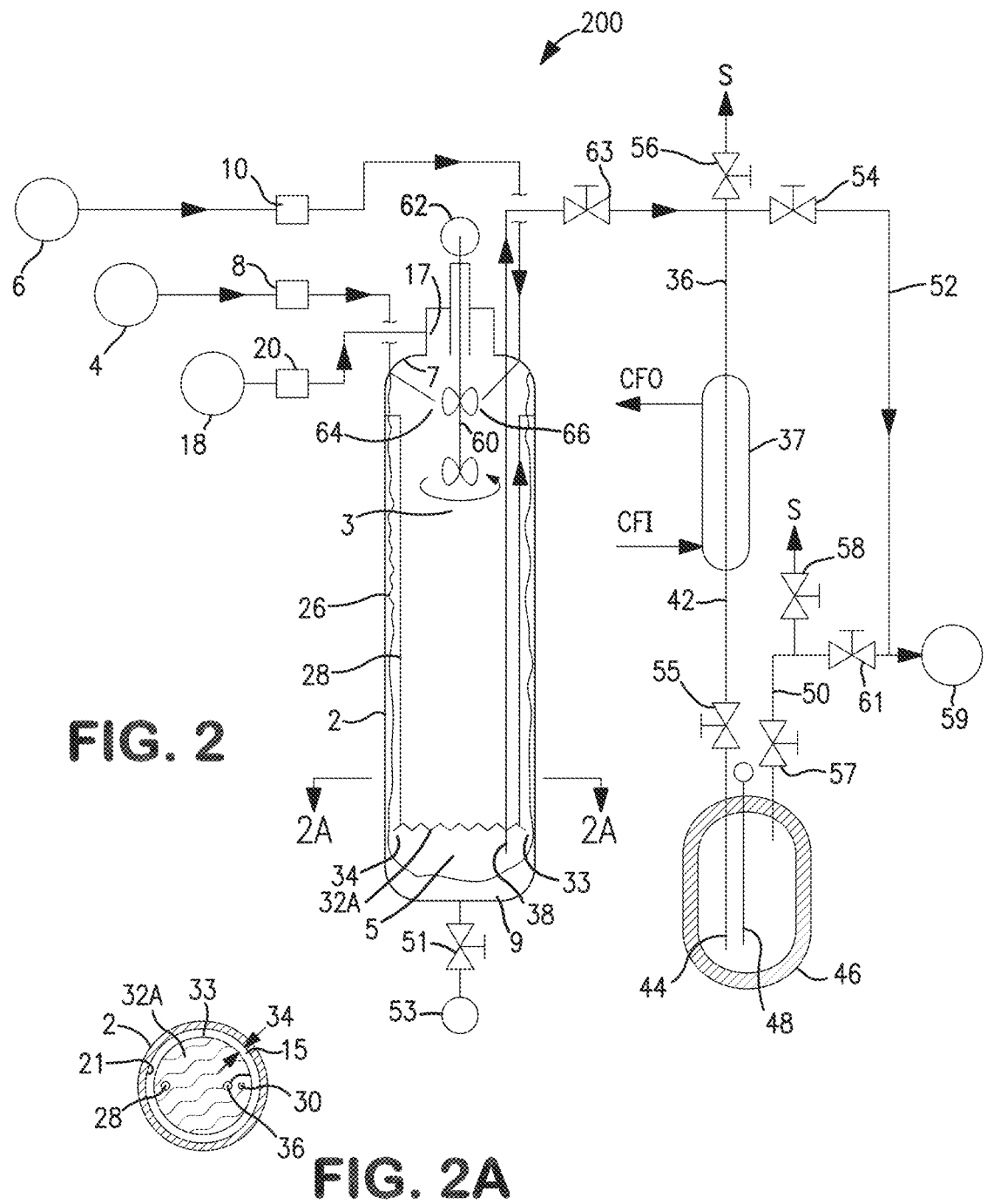

Referring now to FIGS. 2 and 2A, embodiment 200 is similar to embodiment 100, but differs in key features. One key feature is the replacement of the flat baffle plate (32) of embodiment 100 with a corrugated baffle plate (32A), which provides more surface area than a flat plate, and may allow for greater collection of ammonium halide powder than does a flat plate, allowing for longer run times of the system before cleanout. Another feature is the addition of a mechanical stirring device (60), in this embodiment a stirrer having impellers that rotate as illustrated by the curved arrow. A motor (62) and shaft may be used for rotating the stirring impellers. Other embodiments may employ a magnetic stirring device, where a permanent magnet or an electromagnet is employed outside of reactor vessel (2) to cause movement of a ferromagnetic stirrer. Another difference between embodiment 100 and 200 is the provision injection nozzles (64, 66) that force reactant gases MCS and ammonia to mix by impingement of the flows in the vicinity of impellers (60), further adding to creating of turbulence. The mechanical mixer (60) should be capable of exerting enough force so the flow of reactant gases has Reynolds Numbers (Re) at least in the transient flow regime, where transient flow Re ranges from about 2300 to about 4000, and in certain embodiments exerting enough force so the flow of reactant gases has Re in turbulent flow conditions, where Re>4000.

Referring now to FIGS. 3, 3A, and 3B embodiment 300 is similar to embodiment 100, but differs in key features. One feature is the co-current flow of reactant gases MCS and ammonia into the reactor vessel (2), rather than an annular flow as in embodiment 100. As illustrated schematically in FIGS. 3 and 3B, gas inlets (11, 13) are essentially arranged side-by-side, causing the flow of reactant gases MCS to be co-current as they pass into the reactor vessel toward a static mixer (70), which may be one or more circular members made of porous steel mesh (for example, but not limited to, steel wool), porous ceramic material (for example, but not limited to, a ceramic grating), porous polymeric material, and the like. Static mixer (70) is supported in embodiment 300 by support brackets (28, 30), but may be attached to inner surface of (21) of reactor vessel (2) by local brackets (not illustrated). Static mixer (7) functions to cause turbulence, or turbulent flow, of the mixing reactants, but should have void regions sufficiently large to not impede flow of reactant gases more than enough to cause significant turbulence above laminar flow conditions. In other words, the static mixer (70) should be capable of exerting enough blocking force so the flow of reactant gases has Reynolds Numbers in transient or turbulent flow regimes, where transient flow Re ranges from about 2300 to about 4000, and turbulent flow conditions have Re>4000. For example, the openings in a screen grating may range from about 0.01 cm to about 5 cm, or from about 0.1 cm to about 3 cm, or from about 0.1 to about 1 cm.

Still referring to FIGS. 3 and 3A, system embodiment 300 differs from embodiments 100 and 200 by having a conical baffle (32B) having a cone angle "a" that may range from about 90 to about 175 degrees, or from about 100 to about 160 degrees. Conical baffle (32B) may have certain advantages. As the ammonium halide powder collects on the conical baffle, a greater amount should build up toward the peripheral edge (33) of the conical baffle than on regions near the cone vertex (72), creating a filtering affect.

Figure 4B:
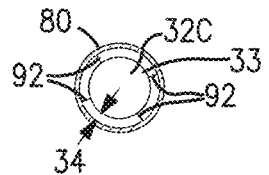

Referring now to FIGS. 4, 4A, and 4B, embodiment 400 differs from embodiments 100, 200, and 300 by having a cyclone-shaped reactor vessel (2) having a conical section (80), a tangential feed chamber (82) feeding a cylindrical section (84), and an exhaust stack (86). The cyclone-shaped reactor vessel (2) under suitable conditions produces turbulent flow in the reaction zone to promote effective reactant gas-phase mixing and a sufficient reaction pathway with residence time. Conical section (80) has a cone angle "β" ranging from about 45 degrees to just less than about 90 degrees, or from about 45 degrees to about 75 degrees, or from about 45 degrees to about 65 degrees. The cyclone-shaped reactor vessel (2) can be operated in a continuous mode or semi-continuous mode. In one embodiment, the cyclone-shaped reactor vessel (2) can be operated in a continuous mode that allows separation of the gaseous reaction product from the solids reaction product without the usage of baffles. The reaction product solids fall downward by gravity towards the bottom (9) of cyclone-shaped reactor vessel (2), thereby allowing their removal, while the vapor product stream is directed upwards towards the top (7) of cyclone-shaped reactor vessel (2) and exits therefrom. In one example, the vapor product can enter into the bottom of product conduit (36) and then flow in an upward direction within the product conduit (36) until exiting from the top (7) of cyclone-shaped reactor vessel (2). As illustrated schematically in the plan view of FIG. 4A, tangential feed chamber (82) directs feed ammonia and MCS gaseous reactants tangentially into cylindrical section (84), and then into conical section (80), for better reactant gas mixing and longer reaction path. These embodiments may also allow solid/gas separation, possibly in a continuous mode of operation, with the solids falling by gravity downward and vapor product stream going upward. In another embodiment, the cyclone-shaped reactor vessel (2) can be configured to be equipped with one or more baffles, thereby allowing embodiment 400 to operate in a batch mode (i.e., semi-continuous mode). Optionally a baffle may also be employed. As illustrated in the cross-sectional view 4B-4B in FIG. 4B, a circular flat plate baffle (32C) having a diameter smaller than the internal diameter (D) of reactor vessel (2) is positioned near the bottom of the conical section (80), creating a reaction zone (3) and a separation zone (5) as in other embodiments, and positioned so that a gap (34) exists between peripheral edge (33) and the reactor vessel inner surface. Local brackets (92) are employed in this embodiment, which may be welded, brazed, or otherwise attached to the reactor sidewall and to the flat baffle plate (32C). If a baffle is used, one further advantage of embodiment 400 is that the product conduit (36) may pass centrally up through baffle plate (32C), top (7) of reactor vessel (2), and through exhaust stack (86). An exhaust conduit (87) nay route reactor vessel exhaust from stack (86) to downstream exhaust or waste processing stations (90). Product conduit (36) routes TSA to downstream processing equipment such as illustrated in FIGS. 1-3 (product cooler (37), TSA collection vessel (46), and the like) or to storage (88). A valve (145) may allow TSA from a disproportionation unit (FIG. 5) to mix with TSA produced in reactor vessel (2).

Yet other process and system embodiments may include one or more optional components and steps to accomplish in situ dry cleaning to remove or significantly reduce ammonium chloride ($NH_4Cl$) deposits on the reactor interior, baffles, gas injection nozzles, and other equipment such as baffle supports. This may be accomplished using fluorine radicals, either gaseous or plasma, or mixture thereof, for example, but not limited to, hot fluorine or fluorine plasma, ammonia plasma, and the like. FIG. 4 illustrates the provision of a source (94) of fluorine, fluorine plasma, or other cleaning gas or plasma for the purpose of cleaning reactor vessel (2). A mass flow controller (96) and conduit (98) may be provided for such purposes. It will be understood by those skilled in the art that suitable valves and manifolding would be involved to block flow of reactant gases during a cleaning operation; these valves are not illustrated for brevity.

Certain process and system embodiments may include one or more optional MCS purification steps to reduce DCS content in the raw MCS feed material. Due to the reported stability issues with MCS, some undesirable DCS (and $SiH_4$) may be formed in the raw MCS material during shipment (disproportionation). Due to the significant vapor pressure difference, one or more distillation steps may effectively be used. In certain embodiments the DCS concentration in the MCS feed to the reactor may be set as a process control goal. One such optional MCS purification sub-system is illustrated schematically in FIG. 4, comprising for example first and second separators (102, 104), the first separator (102) taking feed of MCA having impurities therein (raw MCS) from a source 4A. First separator (102) separates silane and lighter components from the raw MCS through a conduit (108) and routes them to further processing or storage (110), producing a stream enriched in MCS and heavier components that is routed through a conduit (106) to a second separator (104), or if no impurities heavier than MCS are present, directly into reactor vessel (2) through a bypass conduit (107). Separator (104) overhead consists essentially of pure MCS and is routed through conduit (16) to reactor vessel (2), while components heavier than MCS are removed through the bottoms conduit (112) to further processing (114).

Figure 5:
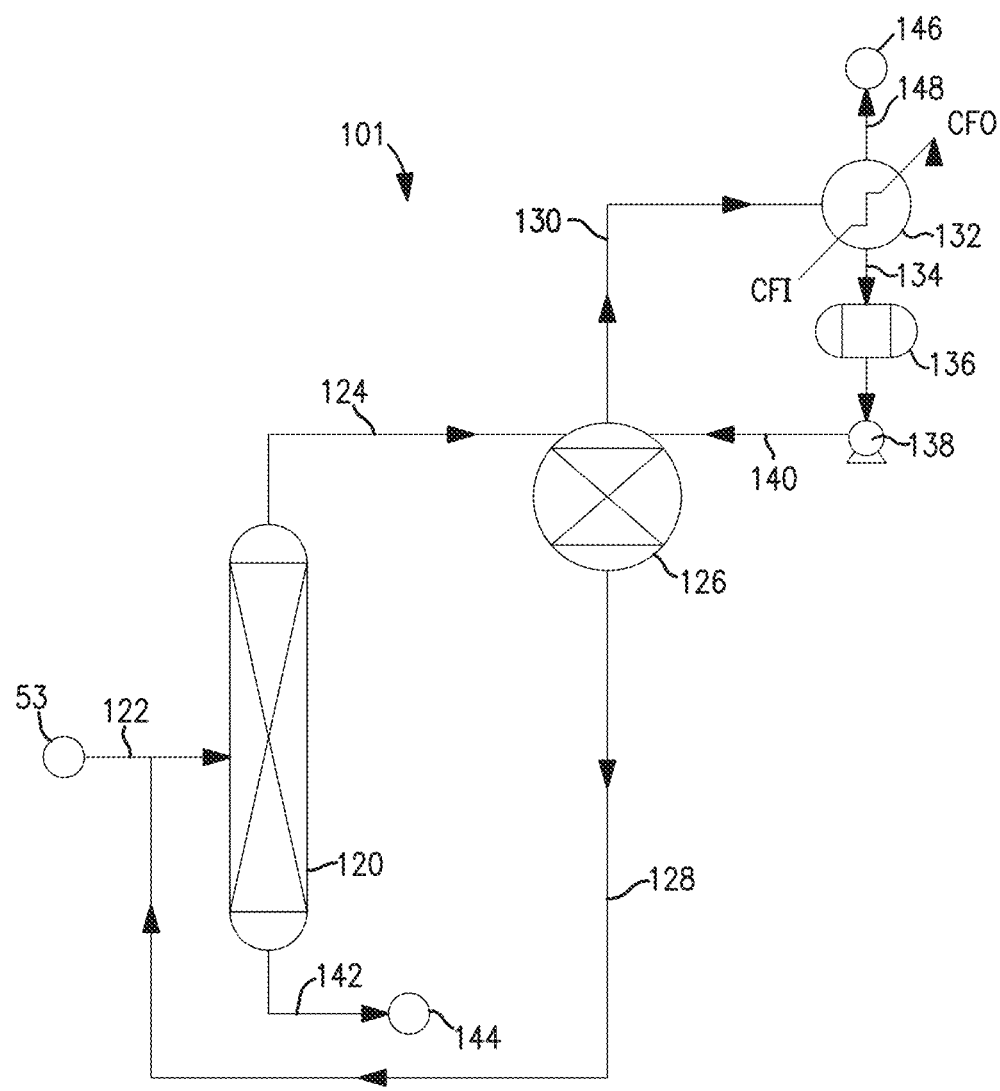
FIG. 5 is a high-level schematic process flow diagram of a disproportionation unit including a disproportionation reactor that may be used in conjunction with any of the systems and processes of the present disclosure, and in certain embodiments may be integrated into systems and processes of the present disclosure.
Figure 6:
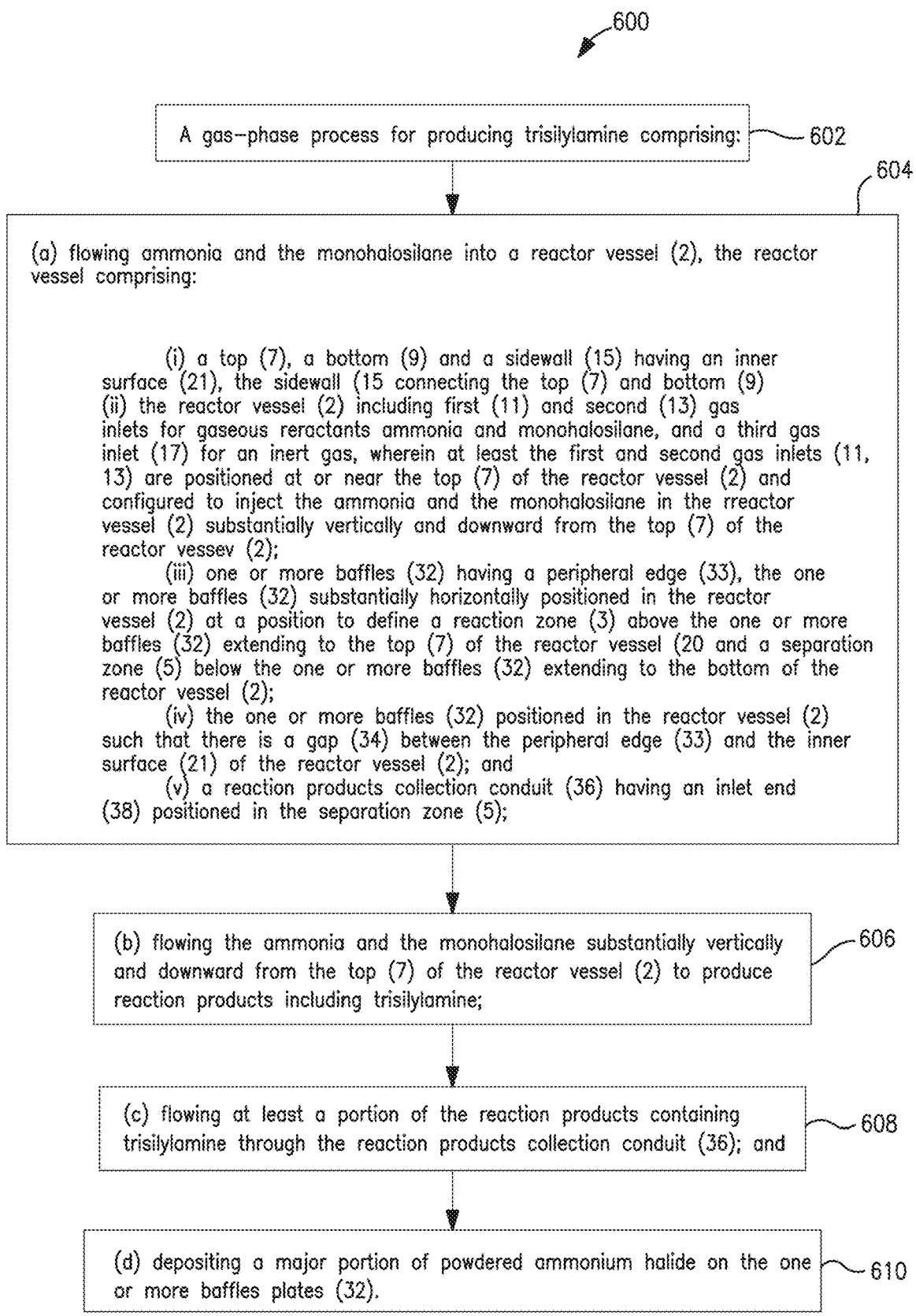
FIGS. 6-9 are schematic logic diagrams of four process embodiments in accordance with the present disclosure.
Figure 7:
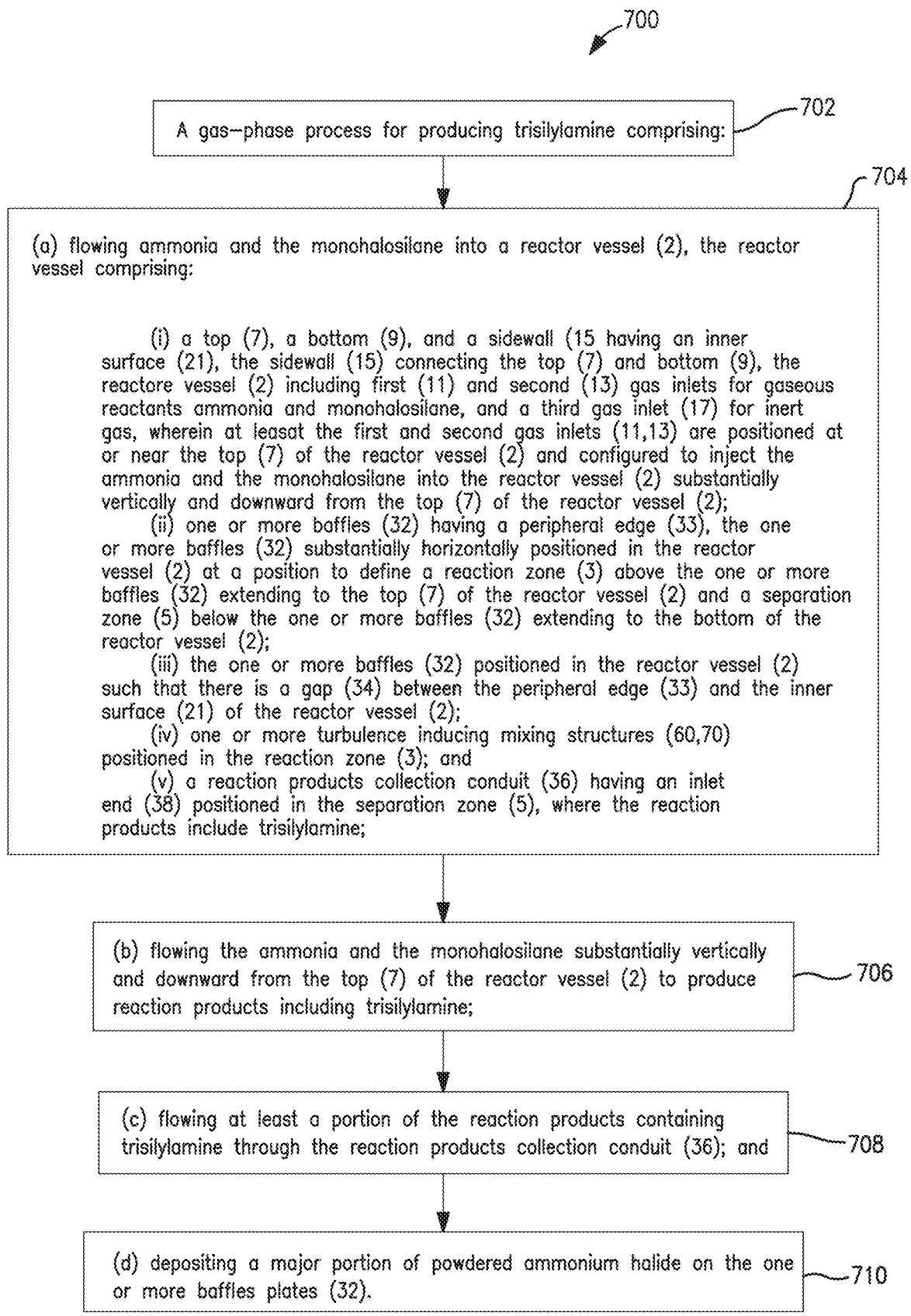
Figure 8:
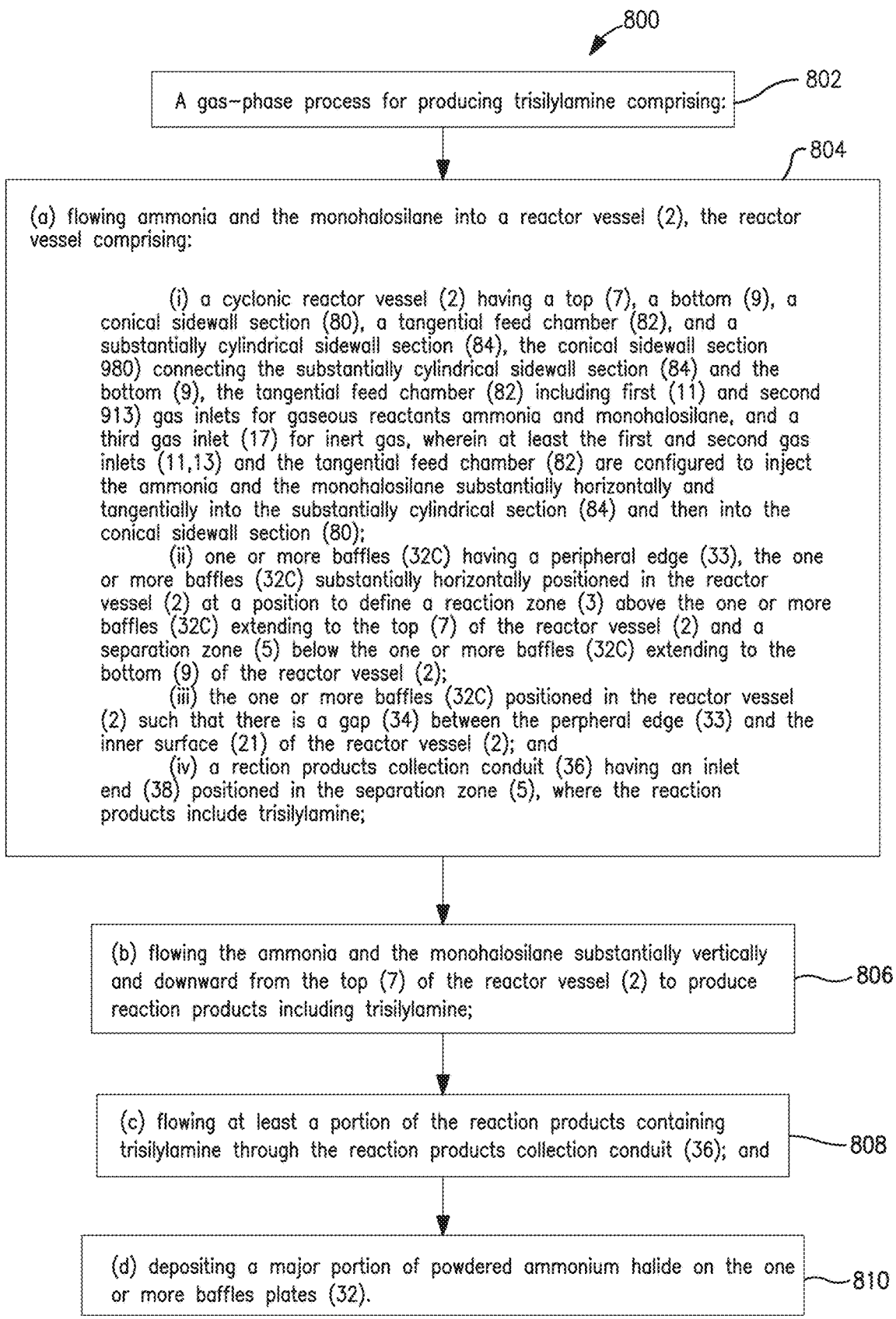
Figure 9:
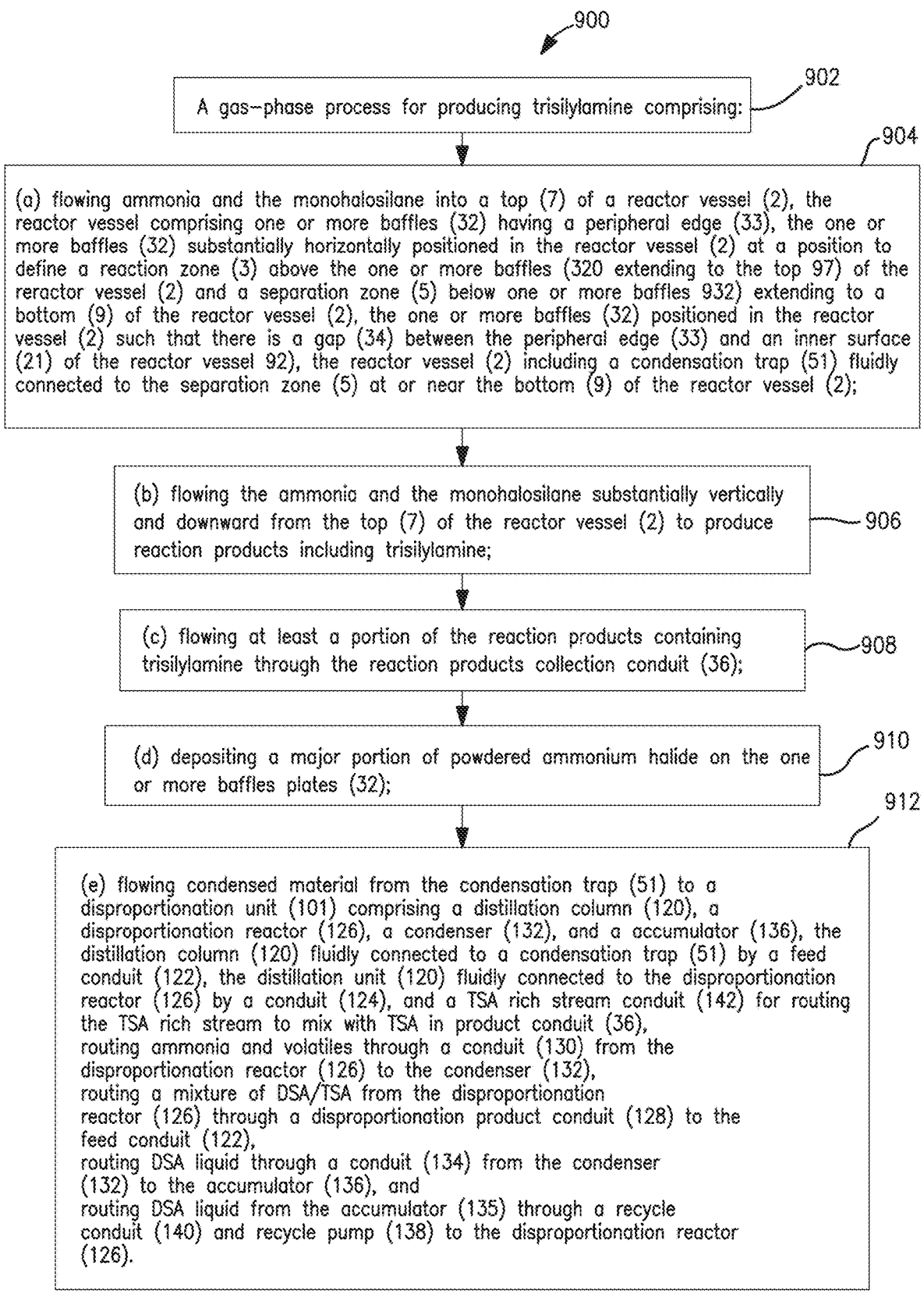

Referring now to FIG. 5, it is known from Aylett and Hakim (1966) that DSA in the liquid form can undergo disproportionation reaction to form TSA and ammonia through the reaction scheme (6). The presence of ammonia is however known by Well and Schaeffer (1966) to catalyze the elimination of silane from TSA through the reaction scheme (8). Thus, if the DSA disproportionation reaction is carried out in a closed vessel, the by-product ammonia will lead to a parallel elimination of silane from the TSA and forming undesired products of polysilazane. FIG. 5 illustrates schematically one embodiment 101 of a DSA disproportionation unit useful in the systems and processes of the present disclosure, comprising a distillation column (120), disproportionation reactor (126), condenser (132), an accumulator (136), and a recycle pump (138). A feed conduit (122) feeds condensed material received from condensation trap (51, 53), producing a DSA vapor overhead stream that is routed via a conduit (124) to disproportionation reactor (126). A TSA-rich stream is routed via a conduit (142) from the bottom of distillation unit (120) to storage, or back to mix with TSA collected from TSA collection vessel (46) (see FIG. 4). The DSA disproportionation reaction is carried out in such a way that all ammonia formed in the reaction is removed simultaneously by vaporization, for example through a conduit (130). The ammonia vapor which also contains part of the DSA vapor is subsequently passed through a condenser (132) to condense and reflux the DSA (via conduit (134), accumulator (136), recycle pump (138), and recycle conduit (140) back to the disproportionation reactor (126). Uncondensed ammonia vapor is vent for recycle or disposal through conduit (148). In certain embodiments, the DSA disproportionation reaction can be carried out directly from the collected TSA/DSA liquid. Alternatively, DSA along with other volatile impurities such as silane can be separated easily from TSA by evaporation or distillation, such as illustrated in FIG. 5. Distillation of DSA from crude TSA is relatively straightforward as there is noticeable difference in boiling points of DSA (36° C.) and TSA (52° C.). In certain embodiments, the TSA/DSA separation unit (120) may be used in conjunction with the DSA disproportionation reactor (126) and an ammonia & volatile components separating unit so that all other volatile impurities such as ammonia and silane can be removed (146). TSA/DSA products from DSA disproportionation reactor (126) are routed via a conduit (128) to the TSA/DSA separation (distillation) unit (120). The final TSA effluent may then be routed to a final purification step (not illustrated) to remove the low volatile polysilazanes prior to being routed to a downstream semiconductor manufacturing process, or to storage (144). There is no solid ammonium halide formed in the system which greatly benefits the operation and cleaning. The TSA thus obtained is not only high in purity but also free from dissolved ammonia and is thus stable for storage for extend periods of time.

FIGS. 6-9 are schematic logic diagrams of four process embodiments in accordance with the present disclosure. Process embodiment 600 is a gas-phase process for producing trisilylamine comprising (box 602):
- (a) flowing ammonia and the monohalosilane into a reactor vessel (2), the reactor vessel comprising:
  - (i) a top (7), a bottom (9), and a sidewall (15) having an inner surface (21), the sidewall (15) connecting the top (7) and bottom (9),
  - (ii) the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
  - (iii) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
  - (iv) the one or more baffles (32) positioned in the reactor vessel (2) such that there is a gap (34) between the peripheral edge (33) and the inner surface (21) of the reactor vessel (2); and
  - (v) a reaction products collection conduit (36) having an inlet end (38) positioned in the separation zone (5) (box 604);
- (b) flowing the ammonia and the monohalosilane substantially vertically and downward from the top (7) of the reactor vessel (2) to produce reaction products including trisilylamine (box 606);
- (c) flowing at least a portion of the reaction products containing trisilylamine through the reaction products collection conduit (36) (box 608); and
- (d) depositing a major portion of powdered ammonium halide on the one or more baffles plates (32) (box 610).

Process embodiment 700 is a gas-phase process for producing trisilylamine comprising (box 702):
- (a) flowing ammonia and the monohalosilane into a reactor vessel (2), the reactor vessel comprising (box 702):
  - (i) a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane into the reactor vessel (2) substantially vertically and downward from the top (7) of the reactor vessel (2);
  - (ii) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);

(iii) the one or more baffles (32) positioned in the reactor vessel (2) such that there is a gap (34) between the peripheral edge (33) and the inner surface (21) of the reactor vessel (2);
(iv) one or more turbulence inducing mixing structures (60, 70) positioned in the reaction zone (3); and
(v) a reaction products collection conduit (36) having an inlet end (38) positioned in the separation zone (5), where the reaction products include trisilylamine (box 704);
(b) flowing the ammonia and the monohalosilane substantially vertically and downward from the top (7) of the reactor vessel (2) to produce reaction products including trisilylamine (box 706);
(c) flowing at least a portion of the reaction products containing trisilylamine through the reaction products collection conduit (36) (box 708); and
(d) depositing a major portion of powdered ammonium halide on the one or more baffles plates (32) (box 710).

Process embodiment 800 is a gas-phase process for producing trisilylamine comprising (box 802):
(a) flowing ammonia and the monohalosilane into a reactor vessel (2), the reactor vessel comprising:
(i) a cyclonic reactor vessel (2) having a top (7), a bottom (9), a conical sidewall section (80), a tangential feed chamber (82), and a substantially cylindrical sidewall section (84), the conical sidewall section (80) connecting the substantially cylindrical sidewall section (84) and the bottom (9), the tangential feed chamber (82) including first (11) and second (13) gas inlets for gaseous reactants ammonia and monohalosilane, and a third gas inlet (17) for an inert gas, wherein at least the first and second gas inlets (11, 13) and the tangential feed chamber (82) are configured to inject the ammonia and the monohalosilane substantially horizontally and tangentially into the substantially cylindrical section (84) and then into the conical sidewall section (80);
(ii) one or more baffles (32C) having a peripheral edge (33), the one or more baffles (32C) substantially horizontally positioned in the reactor vessel (2) at a position to define a reaction zone (3) above the one or more baffles (32C) extending to the top (7) of the reactor vessel (2) and a separation zone (5) below the one or more baffles (32C) extending to the bottom (9) of the reactor vessel (2);
(iii) the one or more baffles (32C) positioned in the reactor vessel (2) such that there is a gap (34) between the peripheral edge (33) and the inner surface (21) of the reactor vessel (2); and
(iv) a reaction products collection conduit (36) having an inlet end (38) positioned in the separation zone (5), where the reaction products include trisilylamine (804);
(b) flowing the ammonia and the monohalosilane substantially vertically and downward from the top (7) of the reactor vessel (2) to produce reaction products including trisilylamine (806);
(c) flowing at least a portion of the reaction products containing trisilylamine through the reaction products collection conduit (36) (box 808); and
(d) depositing a major portion of powdered ammonium halide on the one or more baffles plates (32) (box 810).

Process embodiment 900 is a gas-phase process for producing trisilylamine comprising (box 902):
(a) flowing ammonia and the monohalosilane into a top (7) of a reactor vessel (2), the reactor vessel comprising one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to a bottom (9) of the reactor vessel (2), the one or more baffles (32) positioned in the reactor vessel (2) such that there is a gap (34) between the peripheral edge (33) and an inner surface (21) of the reactor vessel (2), the reactor vessel (2) including a condensation trap (51) fluidly connected to the separation zone (5) at or near the bottom (9) of the reactor vessel (2) (box 904);
(b) flowing the ammonia and the monohalosilane substantially vertically and downward from the top (7) of the reactor vessel (2) to produce reaction products including trisilylamine (906);
(c) flowing at least a portion of the reaction products containing trisilylamine through a reaction products collection conduit (36) (box 908);
(d) depositing a major portion of powdered ammonium halide on the one or more baffles plates (32) (box 910); and
(e) flowing condensed material from the condensation trap (51) to a disproportionation unit (101) comprising a distillation column (120), a disproportionation reactor (126), a condenser (132), and an accumulator (136), the distillation column (120) fluidly connected to a condensation trap (51) by a feed conduit (122), the distillation unit (120) fluidly connected to the disproportionation reactor (126) by a conduit (124), and a TSA rich stream conduit (142) for routing the TSA rich stream to mix with TSA in product conduit (36),
routing ammonia and volatiles through a conduit (130) from the disproportionation reactor (126) to the condenser (132),
routing a mixture of DSA/TSA from the disproportionation reactor (126) through a disproportionation product conduit (128) to the feed conduit (122),
routing DSA liquid through a conduit (134) from the condenser (132) to the accumulator (136), and
routing DSA liquid from the accumulator (136) through a recycle conduit (140) and recycle pump (138) to the disproportionation reactor (126) (box 912).

The geometry of the reactor vessel (2) may be cylindrical, rectangular, conical, or combination thereof, with an aspect (L/D) ratio of 0.1 to 100, preferably 1 to 10. In the case of non-circular transverse cross-sections, the diameter of the reactor vessel may be expressed as a hydraulic diameter, or $D_h = 4A/p$, where A is the transverse cross-sectional area of the reactor vessel, and p is the wetted perimeter. The volume of the vessel can be as large as possible such that the reaction can proceed continuously with only short interruption for cleaning. After each reaction batch or semi-batch the solid ammonium halide can be removed and collected directly in dry without the use of water which is relatively pure without the presence of silylamines and can be utilized in an appropriate way. This greatly reduces the cost of handling and disposal of ammonium halide. The feed nozzles of the silyl halide and ammonia can be arranged in typical feed configuration such as but not limited to a co-current flow, an annular flow or an impinging flow fashion. The mixing device may be arranged to promote the flows existing from the nozzles in at least a transient flow pattern, and preferably a turbulent flow pattern.

The reaction temperature and pressure in the preferred embodiment are not limited but are required to maintain the feeds and sylilamine products in a gaseous state. Temperature may generally range from about −20 to about 180° C., or from about 10 to about 150° C., or from about 40 to about 150° C. Reaction pressure may generally range from about 0.01 to about 15 bar (from about 1 to about 1500 kPa), or from about 0.1 to 10 bar (from about 10 kPa to about 1000 kPa), or from about 0.2 to 5 bar (from about 20 to about 500 kPa). Owing to exothermic nature of the reactions, cooling can be added to maintain the desired temperature. Cooling can be provided via heat transfer from the vessel wall or internal coil.

In a feed of the reactants without any additional mechanical mixing such as those described in U.S. Pat. No. 8,409,513 B2, the silyl halide and ammonia react instantaneously and deposit the solid ammonium halide on the feed nozzle. The solid deposit grows along the contact surface of the reactants which not only gradually decreases the mixing of the reactants but also increases the likelihood of plugging of the feed nozzles and vessel wall. The solid deposit on the vessel wall is also difficult to remove rendering the cleaning of the reacting vessel extremely time consuming. In certain embodiments of the present disclosure, mechanical mixing devices and/or static mixers can be added to promote the mixing of the reactant gases. With appropriate mixing devices such as described with reference to embodiments of the present disclosure, the formation of solid deposit on the feed nozzles and vessel wall is reduced and a majority of the solid ammonium halide remains in powder form which can be transported downstream and separated from the gaseous products by the one or more baffles or other separation devices, such as packings, screens, trays, walls, partitions, grids, and the like.

It has also surprisingly been found that mechanical mixing devices can greatly promote the reaction between silyl halide and ammonia which gives higher ratio of TSA to DSA. This in turn minimize the load to convert DSA to TSA. Although the DSA conversion to TSA can be done with excess silyl halide through reaction scheme (3) or (8), the conversion results in formation of solid ammonium halide in the TSA/DSA liquid mixture which requires an additional separation step. The separated ammonium halide still contains part of TSA/DSA and thus requires special treatment waste process. An extra separation step is also needed to separate and recycle the excess silyl halide to reduce the cost.

EXAMPLES

Example 1

Figure 10:
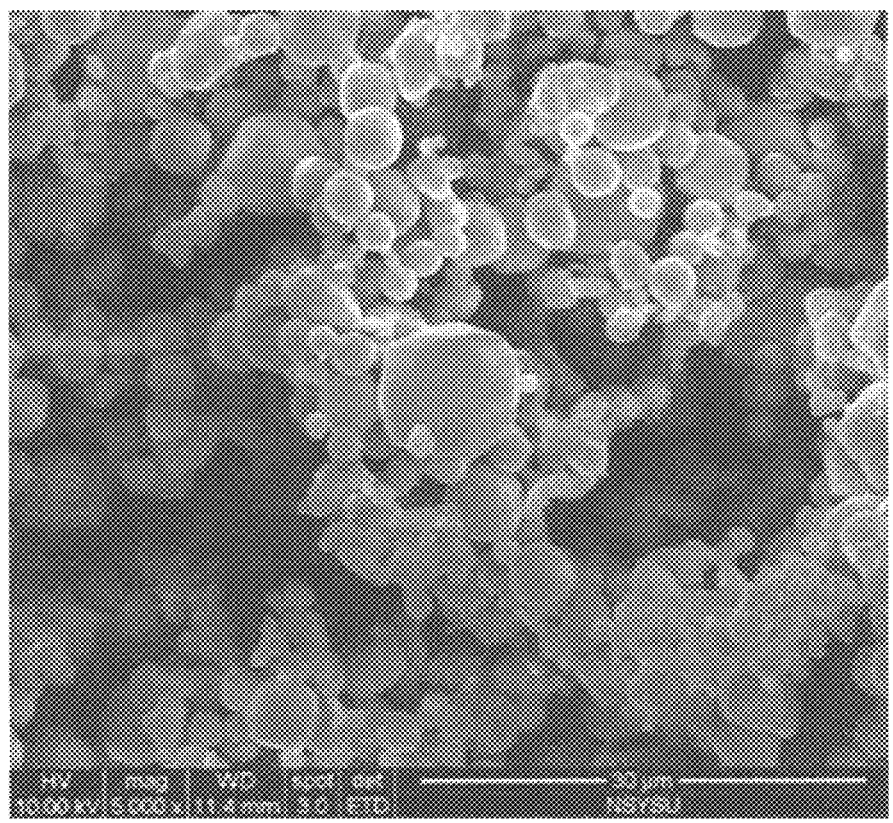
FIGS. 10 and 11 are SEM photos of ammonium chloride solid powder removed from a reactor of one embodiment of the systems of the present disclosure.
Figure 11:
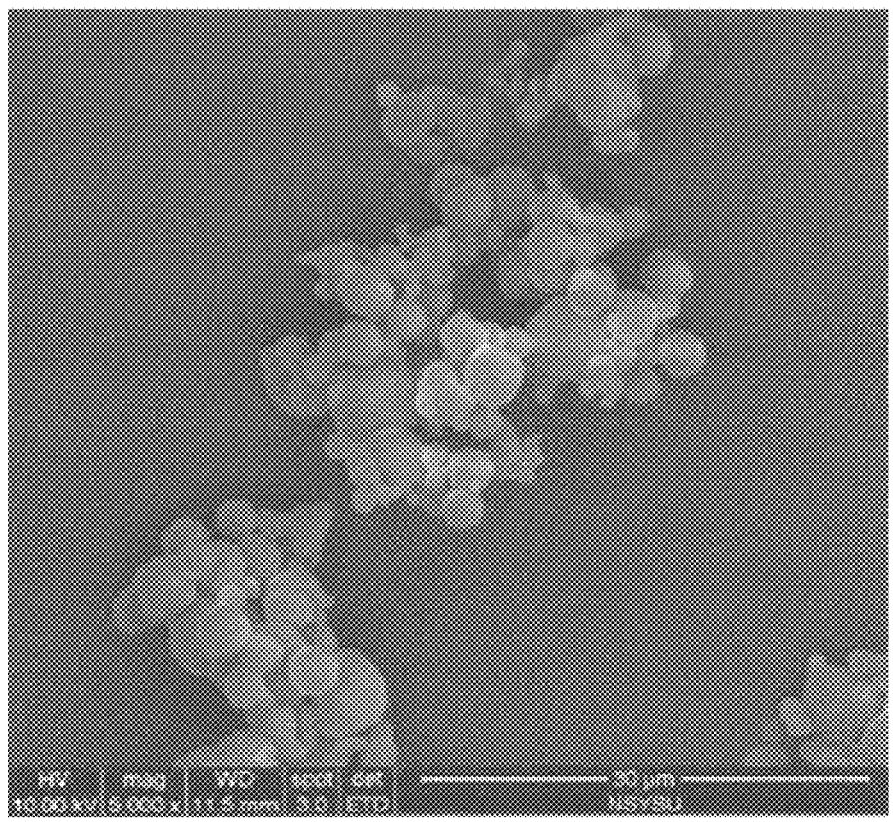

A cylindrical stainless steel reactor having an L/D ratio of 10 with an internal volume of 8 L and an internal diameter (D) of 10 cm was used. A flat, substantially horizontal, stainless steel baffle plate having a diameter of 9.8 cm was installed at the bottom section of the reactor. The volume below the baffle plate was about 1.5 L. Gaseous ammonia (supplied from a cylinder with flow controlled by a MFC at T=28° C. and regulated to P=3 bar) and gaseous MCS (also supplied from a cylinder with flow controlled by a MFC at T=28° C. and regulated to P=3 bar) were fed into the top of the reactor in an annular flow like FIG. 1, which was maintained at T=30-140° C., and P=0.3-0.5 bar. Vapor product was withdrawn from a conduit connecting to the downstream of the baffle plate as in the fashion illustrated in FIG. 1. No particle filter was used in the vapor product conduit. The gaseous ammonia was fed into the reactor at a rate of 1.93 L/min. The monochlorosilane was fed into the reactor at a rate of 1.49 L/min. The reaction continued for 256 minutes and was stopped by shutting off feed gases when the vapor product conduit was partially plugged, as evidenced by the gradual increase of the reactor pressure. Approximately ½ of the ammonium chloride produced was in powder form (the powder is shown in the photos of FIGS. 10 and 11) accumulating on the baffle plate. Remaining solid deposited on the reactor wall and feed nozzles. The gases reacted to form disilylamine, trisilylamine and ammonium chloride. The amount of ammonium chloride collected was 739.8 g. The amount of product vapor condensed at −30° C. and collected was 444 g. Ratio of DSA to TSA was about 2.5 based on on-line GC-TCD analysis ("GC-TCD" is gas chromatograph with thermal conductivity detector). Overall yield of TSA was 78%. The GC-TCD equipment used: column: DB-1, 105 m, 0.53 mm ID, 5 micron film. The GC was an Agilent 7820 with a TCD detector. Temperature program was initially isothermal at 35° C. for 5 min, followed by ramp up to 175° C. at a rate of 14° C./min, and held isothermal for another 12 min.

Example 2

The same reactor as Example 1 was used except that a mechanical, magnetic stirrer was installed at top of the reactor, and two baffle plates stacked in parallel with a separation distance of 5 cm were installed at bottom section of the reactor. The volume below the baffle plates was about 2.5 L. The mixing impeller was located close to and beneath the feed nozzles as in fashion similar to FIG. 2. Gaseous ammonia (at 28° C. and 3 bar) was fed into the reactor at a rate of 1.93 L/min. Gaseous monochlorosilane (at 28° C. and 3 bar) was fed into the reactor at a rate of 1.49 L/min. The reaction continued for 400 minutes and the vapor product line was not plugged. Approximately ¾ of the ammonium chloride produced was in powder form (FIGS. 10 and 11) accumulating on the baffle plates. The remaining solid deposited mainly on the reactor wall and very little on the feed nozzles. The amount of ammonium chloride collected was 1234.6 g. The amount of product vapor condensed at −30° C. and collected was 806.7 g. The ratio of DSA to TSA was about 0.4 based on on-line GC-TCD analysis. Overall yield of TSA was 87%.

As demonstrated by the Examples herein, a majority of the ammonium halide powder accumulated on the baffle plate and remained in loose form without plugging the gap between the baffle plate and reactor vessel wall. Without the mechanical mixing device, most particles aggregated together, eventually forming solid block and plugged on the vessel and nozzles. FIGS. 10 and 11 show SEM photos of the ammonium chloride powder generated during Example 2. The ammonium chloride particle size was in the range of 1-5 μm (micrometers). The particles were loosely packed and remained free-flowing which allowed easy removal in a short time. Elemental analysis of the powder showed only nitrogen and chlorine without any detectable silicon. This confirmed that there was no silyl chloride or other silicon byproducts deposited on the powder.

The systems and sub-systems of the present disclosure may be built to meet ISO standards, SEMI (formerly Semiconductor Equipment and Materials International) standards, American Bureau of Standards (ABS) standards, American Society of Testing Materials (ASTM) standards, and/or other standards.

The electrical connections, if used (voltage and amperage) will be appropriate for the zone rating desired of each system. In certain embodiments one or more electrical cables may be run and connected to an identified power supply at the work site to operate the HMI, gaseous feed material supplies, gas cabinets, and the like. Certain embodiments may employ a dedicated power supply. The identified or dedicated power supply may be controlled by one or more logic devices so that it may be shut down. In exemplary embodiments, systems of the present disclosure may have an electrical isolation (lockout) device on a secure cabinet.

In embodiments where connection to one or more remote HMI units is desired, this may be achieved by an intrinsically safe cable and connection to allow system components to operate in the required zoned area. If no remote access is required, power to operate the systems and sub-systems may be integral to the apparatus, such as batteries, for example, but not limited to, Li-ion batteries. In these embodiments, the power source may be enclosed allowing it to operate in a zoned area (Zone 0 (gases) in accordance with International Electrotechnical Commission (IEC) processes). By "intrinsically safe" is meant the definition of intrinsic safety used in the relevant IEC apparatus standard IEC 60079-11, defined as a type of protection based on the restriction of electrical energy within apparatus and of interconnecting wiring exposed to a potentially explosive atmosphere to a level below that which can cause ignition by either sparking or heating effects. For more discussion, see "AN9003—A User's Guide to Intrinsic Safety", retrieved from the Internet Jul. 12, 2017, and incorporated herein by reference.

In certain embodiments, internal algorithms in the logic device, such as a PLC, may calculate a rate of increase or decrease in pressure and temperature inside the reactor vessel and/or other equipment and units described herein. This data may then be displayed or audioed in a series of ways such as "percentage to shutdown" lights or sounds, and the like on one or more GUIs. In certain embodiments, an additional function within an HMI may be to audibly alarm when the calculated pressure or temperature rate of increase or decrease reaches a level set by the operator.

Reactor vessels, baffles, baffle supports, static and mechanical mixers, supply and exhaust conduits therefore, separators, pumps, logic devices, sensors, and other equipment described herein should be capable of withstanding long term exposure to probable liquids and vapors encountered in a semiconductor manufacturing environment, including acids, acid gases, and fluids typically encountered in semiconductor manufacturing facilities and cryogenic processing facilities.

In alternative embodiments, the reactor vessel and various sub-systems and gaseous material supplies may be enclosed within a frame or cabinet, and/or truck-mounted, and/or skid-mounted. Moreover, the various components (such as reactor vessels, baffles, baffle supports, mixers, separators, distillation columns, and the like) need not have specific shapes or specific conduit routing as illustrated in the drawings, but rather could take any shape, such as a box, cube or other rectangular shape, elliptical, triangular, prism-shaped, hemispherical or semi-hemispherical-shaped (dome-shaped), or combination thereof and the like, as long as the equipment performs the desired function or functions indicated herein. The reactor, conduit and column cross-sections need not be round, but may be rectangular, triangular, round, oval, and the like. It will be understood that such embodiments are part of this disclosure and deemed with in the claims. Furthermore, one or more of the various components may be ornamented with various ornamentation produced in various ways (for example stamping or engraving, or raised features such as reflectors, reflective tape), such as facility designs, operating company designs, logos, letters, words, nicknames (for example PPMI, LINDE, and the like).

Thus the systems and processes described herein afford ways to produce trisilylamine safely and economically.

Embodiments disclosed herein include:

A: A system for gas phase-phase synthesis of trisilylamine comprising (or consisting essentially of, or consisting of):
  (a) a reactor vessel (2) having a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
  (b) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
  (c) the one or more baffles (32) positioned in the reactor vessel (2) such that there is a gap (34) between the peripheral edge (33) and the inner surface (21) of the reactor vessel (2); and
  (d) a reaction products collection conduit (36) having an inlet end (38) positioned in the separation zone (5), where the reaction products include trisilylamine.

B: A system for gas phase-phase synthesis of trisilylamine comprising (or consisting essentially of, or consisting of):
  (a) a reactor vessel (2) having a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
  (b) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
  (c) the one or more baffles (32) positioned in the reactor vessel (2) such that there is a gap (34) between the peripheral edge (33) and the inner surface (21) of the reactor vessel (2);
  (d) one or more turbulence inducing mixing structures (60, 70) positioned in the reaction zone (3); and
  (e) a reaction products collection conduit (36) having an inlet end (38) positioned in the separation zone (5), where the reaction products include trisilylamine.

C: A system for gas phase-phase synthesis of trisilylamine comprising: (or consisting essentially of, or consisting of):
(a) a cyclonic reactor vessel (2) having a top (7), a bottom (9), a conical sidewall section (80), a tangential feed chamber (82), and a substantially cylindrical sidewall section (84), the conical sidewall section (80) connecting the substantially cylindrical sidewall section (84) and the bottom (9), the tangential feed chamber (82) including first (11) and second (13) gas inlets for gaseous reactants ammonia and monohalosilane, and a third gas inlet (17) for an inert gas, wherein at least the first and second gas inlets (11, 13) and the tangential feed chamber (82) are configured to inject the ammonia and the monohalosilane substantially horizontally and tangentially into the substantially cylindrical section (84) and then into the conical sidewall section (80);
(b) one or more baffles (32C) having a peripheral edge (33), the one or more baffles (32C) substantially horizontally positioned in the reactor vessel (2) at a position to define a reaction zone (3) above the one or more baffles (32C) extending to the top (7) of the reactor vessel (2) and a separation zone (5) below the one or more baffles (32C) extending to the bottom (9) of the reactor vessel (2);
(c) the one or more baffles (32C) positioned in the reactor vessel (2) such that there is a gap (34) between the peripheral edge (33) and the inner surface (21) of the reactor vessel (2); and
(d) a reaction products collection conduit (36) having an inlet end (38) positioned in the separation zone (5), where the reaction products include trisilylamine.

D: A gas-phase process for producing trisilylamine comprising (or consisting essentially of, or consisting of):
(a) flowing ammonia and the monohalosilane into a reactor vessel (2), the reactor vessel comprising:
(i) a top (7), a bottom (9), and a sidewall (15) having an inner surface (21), the sidewall (15) connecting the top (7) and bottom (9),
(ii) the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
(iii) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
(iv) the one or more baffles (32) positioned in the reactor vessel (2) such that there is a gap (34) between the peripheral edge (33) and the inner surface (21) of the reactor vessel (2); and
(v) a reaction products collection conduit (36) having an inlet end (38) positioned in the separation zone (5);
(b) flowing the ammonia and the monohalosilane substantially vertically and downward from the top (7) of the reactor vessel (2) to produce reaction products including trisilylamine;
(c) flowing at least a portion of the reaction products containing trisilylamine through the reaction products collection conduit (36); and
(d) depositing a major portion of powdered ammonium halide on the one or more baffles plates (32).

E: A gas-phase process for producing trisilylamine comprising (or consisting essentially of, or consisting of):
(a) flowing ammonia and the monohalosilane into a reactor vessel (2), the reactor vessel comprising:
(i) a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane into the reactor vessel (2) substantially vertically and downward from the top (7) of the reactor vessel (2);
(ii) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
(iii) the one or more baffles (32) positioned in the reactor vessel (2) such that there is a gap (34) between the peripheral edge (33) and the inner surface (21) of the reactor vessel (2);
(iv) one or more turbulence inducing mixing structures (60, 70) positioned in the reaction zone (3); and
(v) a reaction products collection conduit (36) having an inlet end (38) positioned in the separation zone (5), where the reaction products include trisilylamine;
(b) flowing the ammonia and the monohalosilane substantially vertically and downward from the top (7) of the reactor vessel (2) to produce reaction products including trisilylamine;
(c) flowing at least a portion of the reaction products containing trisilylamine through the reaction products collection conduit (36); and
(d) depositing a major portion of powdered ammonium halide on the one or more baffles plates (32).

F: A gas-phase process for producing trisilylamine comprising (or consisting essentially of, or consisting of):
(a) flowing ammonia and the monohalosilane into a reactor vessel (2), the reactor vessel comprising:
(i) a cyclonic reactor vessel (2) having a top (7), a bottom (9), a conical sidewall section (80), a tangential feed chamber (82), and a substantially cylindrical sidewall section (84), the conical sidewall section (80) connecting the substantially cylindrical sidewall section (84) and the bottom (9), the tangential feed chamber (82) including first (11) and second (13) gas inlets for gaseous reactants ammonia and monohalosilane, and a third gas inlet (17) for an inert gas, wherein at least the first and second gas inlets (11, 13) and the tangential feed chamber (82) are configured to inject the ammonia and the monohalosilane substantially horizontally and tangentially into the substantially cylindrical section (84) and then into the conical sidewall section (80);

(ii) one or more baffles (32C) having a peripheral edge (33), the one or more baffles (32C) substantially horizontally positioned in the reactor vessel (2) at a position to define a reaction zone (3) above the one or more baffles (32C) extending to the top (7) of the reactor vessel (2) and a separation zone (5) below the one or more baffles (32C) extending to the bottom (9) of the reactor vessel (2);

(iii) the one or more baffles (32C) positioned in the reactor vessel (2) such that there is a gap (34) between the peripheral edge (33) and the inner surface (21) of the reactor vessel (2); and (iv) a reaction products collection conduit (36) having an inlet end (38) positioned in the separation zone (5), where the reaction products include trisilylamine;

(b) flowing the ammonia and the monohalosilane substantially vertically and downward from the top (7) of the reactor vessel (2) to produce reaction products including trisilylamine;

(c) flowing at least a portion of the reaction products containing trisilylamine through the reaction products collection conduit (36); and (d) depositing a major portion of powdered ammonium halide on the one or more baffles plates (32).

G: A gas-phase process for producing trisilylamine comprising (or consisting essentially of, or consisting of):

(a) flowing ammonia and a monohalosilane into a top (7) of a reactor vessel (2), the reactor vessel comprising one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to a bottom (9) of the reactor vessel (2), the one or more baffles (32) positioned in the reactor vessel (2) such that there is a gap (34) between the peripheral edge (33) and an inner surface (21) of the reactor vessel (2), the reactor vessel (2) including a condensation trap (51) fluidly connected to the separation zone (5) at or near the bottom (9) of the reactor vessel (2);

(b) flowing the ammonia and the monohalosilane substantially vertically and downward from the top (7) of the reactor vessel (2) to produce reaction products including trisilylamine;

(c) flowing at least a portion of the reaction products containing trisilylamine through a reaction products collection conduit (36);

(d) depositing a major portion of powdered ammonium halide on the one or more baffles plates (32); and (e) flowing condensed material from the condensation trap (51) to a disproportionation unit (101) comprising a distillation column (120), a disproportionation reactor (126), a condenser (132), and an accumulator (136), the distillation column (120) fluidly connected to a condensation trap (51) by a feed conduit (122), the distillation unit (120) fluidly connected to the disproportionation reactor (126) by a conduit (124), and a TSA rich stream conduit (142) for routing the TSA rich stream to mix with TSA in product conduit (36), routing ammonia and volatiles through a conduit (130) from the disproportionation reactor (126) to the condenser (132), routing a mixture of DSA/TSA from the disproportionation reactor (126) through a disproportionation product conduit (128) to the feed conduit (122), routing DSA liquid through a conduit (134) from the condenser (132) to the accumulator (136), and routing DSA liquid from the accumulator (136) through a recycle conduit (140) and recycle pump (138) to the disproportionation reactor (126).

Each of the embodiments A, B, C, D, E, F, and G may have one or more of the following additional elements in any combination:

Element 1. the reactor vessel (2) is cylindrically shaped and has a length (L), a diameter (D), and an L/D ratio, where the L/D ratio ranges from about 0.1 to about 100, or from about 1 to about 10.

Element 2. the reaction products collection conduit (36) includes a particle filter.

Element 3. a heating and/or cooling sub-system (H/C) thermally connected at least with the reaction zone (3) for temperature control.

Element 4: the heating and/or cooling sub-system (H/C) is configured to maintain the reaction zone (3) at a temperature ranging from about −20° C. to about 180° C., or from about 10° C. to about 150° C., or from about 40° C. to about 150° C.

Element 5: a condensation trap (51) fluidly connected to the separation zone (5) at or near the bottom (9) of the reactor vessel (2) and configured to be maintained at a temperature ranging from about −10° C. to about −80° C. for removing silylamines from the reaction products.

Element 6: a condensation trap (51) fluidly connected to the separation zone (5) at or near the bottom (9) of the reactor vessel (2) and configured to be maintained at a temperature ranging from about −20° C. to about −40° C. for removing silylamines from the reaction products.

Element 7: the reactor vessel (2) is configured to operate at pressures ranging from about 0.01 to about 15 bar (about 1 to about 1500 kPa), or from about 0.1 to 10 bar (about 10 to about 1000 kPa), or from about 0.2 to about 5 bar (about 20 to about 500 kPa).

Element 8: the reactor vessel (2) is configured to operate at temperature and pressure conditions such that the ammonia, the monohalosilane, and the reaction products are all in gas phase.

Element 9: the one or more baffles (32) are selected from the group consisting of flat plate baffles (32, 32C), corrugated plate baffles (32A), and cone-shaped baffles (32B), and the one or more baffles (32, 32A, 32B, and 32C) are supported by brackets selected from the group consisting of two or more hanger support brackets (28, 30) connected at or near the top (7) of the reactor vessel (2) and two or more local support brackets (92) connected to the inner surface (21) of sidewall (15).

Element 10: Methods and systems configured to operate in modes selected from the group consisting of automatic continuous mode, automatic periodic mode, and manual mode.

Element 11: a disproportionation unit (101) comprising a distillation column (120), a disproportionation reactor (126), a condenser (132), and an accumulator (136), the distillation column (120) fluidly connected to a condensation trap (51) by a feed conduit (122), the condensation trap (51) fluidly connected to the separation zone (5) at or near the bottom (9) of the reactor vessel (2), the distillation unit (120) fluidly connected to the disproportionation reactor (126) by a conduit (124), and a TSA rich stream conduit (142) for routing the TSA rich stream to mix with TSA in product conduit (36), the disproportionation unit (126) having a disproportionation product conduit (128) and a conduit (130) for routing ammonia and volatiles to the condenser (132), the condenser (132) having a conduit (134) for routing DSA liquid to the accumulator (136), and the accumulator (136) having a recycle conduit (140) and recycle pump (138) for routing DSA liquid from the accumulator (136) to the disproportionation reactor (126).

Element 12: Methods and systems comprising an HMI including a display with an interactive graphical user interface.

Element 13: the one or more turbulence inducing mixing structure (60, 70) are selected from the group consisting of one or more mechanical stirrers (60) and one or more static mixers (70).

Element 14: the one or more mechanical stirrers (60) are selected from the group consisting of motor-driven impellers and magnetic stirrers.

Element 15: the one or more static mixers (70) are selected from the group consisting of porous ceramic materials, porous steel mesh materials, and like materials, and the one or more static mixers (70) are supported by brackets selected from the group consisting of two or more hanger support brackets (28, 30) connected at or near the top (7) of the reactor vessel (2) and two or more local support brackets (92) connected to the inner surface (21) of sidewall (15).

Element 16: a monohalosilane purification sub-system comprising:
 a first separator (102) configured to accept an impure monohalosilane stream (4A) and produce a silane and lighter compounds stream (108) and an enriched monohalosilane stream (106),
 a second separator (104) configured to accept the enriched monohalosilane stream (106) and produce a reactor feed monohalosilane stream (16) and polysilanes and heavier stream (112).

Element 17: a source of fluorine or fluorine plasma (94), or other cleaning gas or plasma, fluidly connected to the reactor vessel (2), the fluorine or other gas, fluorine plasma or other plasma adapted to clean the reactor vessel (2), the system further comprising a conduit for routing a cleaning exhaust stream to an exhaust or waste handling system (90).

From the foregoing detailed description of specific embodiments, it should be apparent that patentable systems and processes have been described. Although specific embodiments of the disclosure have been described herein in some detail, this has been done solely for the purposes of describing various features and aspects of the systems and processes and is not intended to be limiting with respect to their scope. It is contemplated that various substitutions, alterations, and/or modifications, including but not limited to those implementation variations which may have been suggested herein, may be made to the described embodiments without departing from the scope of the appended claims. For example, one modification would be to deploy redundant valves for safety purposes. Certain systems and processes of this disclosure may be devoid of certain steps, components and/or features: for example, systems and processes devoid of a disproportionation unit; systems and processes devoid of a separator upstream of the reactor vessel; and processes devoid of a recycle pump in the disproportionation unit.

What is claimed is:

1. A system for gas-phase synthesis of trisilylamine comprising:
 (a) a reactor vessel (2) having a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
 (b) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
 (c) the one or more baffles (32) positioned in the reactor vessel (2) such that there is a gap (34) between the peripheral edge (33) and the inner surface (21) of the reactor vessel (2); and
 (d) a reaction products collection conduit (36) having an inlet end (38) positioned in the separation zone (5), where the reaction products include trisilylamine.

2. The system of claim 1 wherein the reactor vessel (2) is cylindrically shaped and has a length (L), a diameter (D), and an L/D ratio, where the L/D ratio ranges from about 0.1 to about 100, or from about 1 to about 10.

3. The system of claim 1 wherein the reaction products collection conduit (36) includes a particle filter.

4. The system of claim 1 comprising a heating and/or cooling sub-system (H/C) thermally connected at least with the reaction zone (3) for temperature control.

5. The system of claim 4 wherein the heating and/or cooling sub-system (H/C) is configured to maintain the reaction zone (3) at a temperature ranging from about −20° C. to about 180° C., or from about 10° C. to about 150° C., or from about 40° C. to about 150° C.

6. The system of claim 1 further comprising a condensation trap (51) fluidly connected to the separation zone (5) at or near the bottom (9) of the reactor vessel (2) and configured to be maintained at a temperature ranging from about −10° C. to about −80° C. for removing silylamines from the reaction products.

7. The system of claim 1 further comprising a condensation trap (51) fluidly connected to the separation zone (5) at or near the bottom (9) of the reactor vessel (2) and configured to be maintained at a temperature ranging from about −20° C. to about −40° C. for removing silylamines from the reaction products.

8. The system of claim 1 wherein the reactor vessel (2) is configured to operate at pressures ranging from about 0.01 to about 15 bar (about 1 to about 1500 kPa), or from about 0.1 to 10 bar (about 10 to about 1000 kPa), or from about 0.2 to about 5 bar (about 20 to about 500 kPa).

9. The system of claim 1 wherein the reactor vessel (2) is configured to operate at temperature and pressure conditions such that the ammonia, the monohalosilane, and the reaction products are all in gas phase.

10. The system of claim 1 wherein the one or more baffles (32) are selected from the group consisting of flat plate baffles (32, 32C), corrugated plate baffles (32A), and cone-shaped baffles (32B), and the one or more baffles (32, 32A, 32B, and 32C) are supported by brackets selected from the group consisting of two or more hanger support brackets (28, 30) connected at or near the top (7) of the reactor vessel (2) and two or more local support brackets (92) connected to the inner surface (21) of sidewall (15).

11. The system of claim 1 further including a disproportionation unit (101) comprising a distillation column (120), a disproportionation reactor (126), a condenser (132), and an accumulator (136), the distillation column (120) fluidly connected to a condensation trap (51) by a feed conduit (122), the condensation trap (51) fluidly connected to the separation zone (5) at or near the bottom (9) of the reactor vessel (2), the distillation unit (120) fluidly connected to the disproportionation reactor (126) by a conduit (124), and a TSA rich stream conduit (142) for routing the TSA rich stream to mix with TSA in product conduit (36), the disproportionation unit (126) having a disproportionation product conduit (128) and a conduit (130) for routing ammonia and volatiles to the condenser (132), the condenser (132) having a conduit (134) for routing DSA liquid to the accumulator (136), and the accumulator (136) having a recycle conduit (140) and recycle pump (138) for routing DSA liquid from the accumulator (136) to the disproportionation reactor (126).

12. A system for gas-phase synthesis of trisilylamine comprising:
(a) a reactor vessel (2) having a top (7), a bottom (9), and a sidewall (15) having an inner surface (21), the sidewall (15) connecting the top (7) and bottom (9), the reactor vessel (2) including first (11) and second (13) gas inlets for gaseous reactants ammonia and monohalosilane, and a third gas inlet (17) for an inert gas, wherein at least the first and second gas inlets (11, 13) are positioned at or near the top (7) of the reactor vessel (2) and configured to inject the ammonia and the monohalosilane in the reactor vessel (2) substantially vertically and downward from the top (7) of the reactor vessel (2);
(b) one or more baffles (32) having a peripheral edge (33), the one or more baffles (32) substantially horizontally positioned in the reactor vessel (2) at a position to define a reaction zone (3) above the one or more baffles (32) extending to the top (7) of the reactor vessel (2) and a separation zone (5) below the one or more baffles (32) extending to the bottom of the reactor vessel (2);
(c) the one or more baffles (32) positioned in the reactor vessel (2) such that there is a gap (34) between the peripheral edge (33) and the inner surface (21) of the reactor vessel (2);
(d) one or more turbulence inducing mixing structures (60, 70) positioned in the reaction zone (3); and
(e) a reaction products collection conduit (36) having an inlet end (38) positioned in the separation zone (5), where the reaction products include trisilylamine.

13. The system of claim 12 wherein the one or more turbulence inducing mixing structure (60, 70) are selected from the group consisting of one or more mechanical stirrers (60) and one or more static mixers (70).

14. The system of claim 13 wherein the one or more mechanical stirrers (60) are selected from the group consisting of motor-driven impellers and magnetic stirrers.

15. The system of claim 13 wherein the one or more static mixers (70) are selected from the group consisting of porous ceramic materials, porous steel mesh materials, and like materials, and the one or more static mixers (70) are supported by brackets selected from the group consisting of two or more hanger support brackets (28, 30) connected at or near the top (7) of the reactor vessel (2) and two or more local support brackets (92) connected to the inner surface (21) of sidewall (15).

16. The system of claim 12, further including a disproportionation unit (101) comprising a distillation column (120), a disproportionation reactor (126), a condenser (132), and an accumulator (136), the distillation column (120) fluidly connected to a condensation trap (51) by a feed conduit (122), the condensation trap (51) fluidly connected to the separation zone (5) at or near the bottom (9) of the reactor vessel (2), the distillation unit (120) fluidly connected to the disproportionation reactor (126) by a conduit (124), and a TSA rich stream conduit (142) for routing the TSA rich stream to mix with TSA in product conduit (36), the disproportionation unit (126) having a disproportionation product conduit (128) and a conduit (130) for routing ammonia and volatiles to the condenser (132), the condenser (132) having a conduit (134) for routing DSA liquid to the accumulator (136), and the accumulator (136) having a recycle conduit (140) and recycle pump (138) for routing DSA liquid from the accumulator (136) to the disproportionation reactor (126).

17. A system for gas-phase synthesis of trisilylamine comprising:
(a) a cyclonic reactor vessel (2) having a top (7), a bottom (9), a conical sidewall section (80), a tangential feed chamber (82), and a substantially cylindrical sidewall section (84), the conical sidewall section (80) connecting the substantially cylindrical sidewall section (84) and the bottom (9), the tangential feed chamber (82) including first (11) and second (13) gas inlets for gaseous reactants ammonia and monohalosilane, and a third gas inlet (17) for an inert gas, wherein at least the first and second gas inlets (11, 13) and the tangential feed chamber (82) are configured to inject the ammonia and the monohalosilane substantially horizontally and tangentially into the substantially cylindrical section (84) and then into the conical sidewall section (80);
(b) one or more baffles (32C) having a peripheral edge (33), the one or more baffles (32C) substantially horizontally positioned in the reactor vessel (2) at a position to define a reaction zone (3) above the one or more baffles (32C) extending to the top (7) of the reactor vessel (2) and a separation zone (5) below the one or more baffles (32C) extending to the bottom (9) of the reactor vessel (2);
(c) the one or more baffles (32C) positioned in the reactor vessel (2) such that there is a gap (34) between the peripheral edge (33) and the inner surface (21) of the reactor vessel (2); and
(d) a reaction products collection conduit (36) having an inlet end (38) positioned in the separation zone (5), where the reaction products include trisilylamine.

18. The system of claim 17 comprising a monohalosilane purification sub-system comprising:
a first separator (102) configured to accept an impure monohalosilane stream (4A) and produce a silane and lighter compounds stream (108) and an enriched monohalosilane stream (106),
a second separator (104) configured to accept the enriched monohalosilane stream (106) and produce a reactor feed monohalosilane stream (16) and polysilanes and heavier stream (112).

19. The system of claim 17 comprising a source of fluorine or fluorine plasma (94) fluidly connected to the reactor vessel (2), the fluorine or fluorine plasma adapted to clean the reactor vessel (2), the system further comprising a conduit for routing a cleaning exhaust stream to an exhaust or waste handling system (90).

20. The system of claim 17, further including a disproportionation unit (101) comprising a distillation column (120), a disproportionation reactor (126), a condenser (132), and an accumulator (136), the distillation column (120) fluidly connected to a condensation trap (51) by a feed conduit (122), the condensation trap (51) fluidly connected to the separation zone (5) at or near the bottom (9) of the reactor vessel (2), the distillation unit (120) fluidly connected to the disproportionation reactor (126) by a conduit (124), and a TSA rich stream conduit (142) for routing the TSA rich stream to mix with TSA in product conduit (36), the disproportionation unit (126) having a disproportionation product conduit (128) and a conduit (130) for routing ammonia and volatiles to the condenser (132), the condenser (132) having a conduit (134) for routing DSA liquid to the accumulator (136), and the accumulator (136) having a recycle conduit (140) and recycle pump (138) for routing DSA liquid from the accumulator (136) to the disproportionation reactor (126).

21. A process for producing trisilylamine employing the system of claim 1.

22. A process for producing trisilylamine employing the system of claim 12.

23. A process for producing trisilylamine employing the system of claim 17.

\* \* \* \* \*